(12) United States Patent
Kim et al.

(10) Patent No.: US 9,936,591 B2
(45) Date of Patent: Apr. 3, 2018

(54) PRINTED CIRCUIT BOARD AND DISPLAY DEVICE HAVING THE SAME

(71) Applicant: Samsung Display Co., Ltd., Yongin-si, Gyeonggi-do (KR)

(72) Inventors: Byoungyong Kim, Seoul (KR); Inseok Yeo, Seoul (KR); Seung-hwa Ha, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/290,894

(22) Filed: Oct. 11, 2016

(65) Prior Publication Data

US 2017/0171990 A1 Jun. 15, 2017

(30) Foreign Application Priority Data

Dec. 10, 2015 (KR) .......................... 10-2015-0176075

(51) Int. Cl.
*H05K 1/11* (2006.01)
*H05K 5/00* (2006.01)
(Continued)

(52) U.S. Cl.
CPC ........... *H05K 5/0017* (2013.01); *H05K 1/113* (2013.01); *H05K 1/116* (2013.01); *H05K 1/181* (2013.01);
(Continued)

(58) Field of Classification Search
CPC ... H05K 1/00; H05K 1/02; H05K 1/11; H05K 1/14; H05K 1/18; H05K 1/28; H05K 1/111; H05K 1/147; H05K 3/00; H05K 3/36; H05K 5/00; G09G 1/00; G09G 3/10; G09G 3/20; G09G 3/32; G09G 3/36; G02F 1/13;
(Continued)

(56) References Cited

U.S. PATENT DOCUMENTS 6,054,975 A * 4/2000 Kurokawa .......... G02F 1/13452
257/E23.055
8,575,735 B2 * 11/2013 Cho .................... H01L 23/4985
257/676

(Continued)

FOREIGN PATENT DOCUMENTS

KR 10-2008-0085443 A 9/2008
KR 10-2011-0014033 A 2/2011
KR 10-2013-0024391 A 3/2013

*Primary Examiner* — Xiaoliang Chen
(74) *Attorney, Agent, or Firm* — Lewis Roca Rothgerber Christie LLP

(57) ABSTRACT

A display device includes a printed circuit board (PCB), two sides of the PCB extending in first and second directions, respectively, the first and second directions crossing each other, pad group areas being defined in the PCB and arranged along the first direction; and a display panel electrically connected to the PCB through the pad group areas, the PCB including: first pads in each of the pad group areas and arranged along a third direction crossing the first and second directions; and second pads in each of the pad group areas, arranged along the third direction, and spaced apart from the first pads, wherein a portion of the first pads is in the first pad area, an other portion of the first pads and a portion of the second pads are in the second pad area, and an other portion of the second pad is in the third pad area.

17 Claims, 15 Drawing Sheets

(51) Int. Cl.
*H05K 1/18* (2006.01)
*H05K 3/34* (2006.01)

(52) U.S. Cl.
CPC ..... *H05K 3/3436* (2013.01); *H05K 2201/094* (2013.01); *H05K 2201/09409* (2013.01); *H05K 2201/09709* (2013.01); *H05K 2201/10128* (2013.01)

(58) Field of Classification Search
CPC .......... G02F 1/133; G02F 1/134; G02F 1/136; G02F 1/1345; G02F 1/1362
USPC ....... 361/767, 749, 803, 100, 149, 204, 205, 361/501; 349/40, 43
See application file for complete search history.

(56) References Cited

U.S. PATENT DOCUMENTS

| | | | | |
|---|---|---|---|---|
| 9,769,919 | B2* | 9/2017 | Park | G02F 1/133305 |
| 9,775,248 | B2* | 9/2017 | Kim | H05K 1/189 |
| 9,812,084 | B2* | 11/2017 | Kim | G09G 5/00 |
| 2003/0117563 | A1* | 6/2003 | Lim | G02F 1/1345 349/149 |
| 2004/0124868 | A1* | 7/2004 | Lim | G02F 1/13452 324/760.01 |
| 2005/0195338 | A1* | 9/2005 | Matsumoto | G02F 1/136204 349/40 |
| 2006/0007086 | A1* | 1/2006 | Rhee | G02F 1/13452 345/87 |
| 2006/0103412 | A1* | 5/2006 | Kimura | G09G 3/006 73/865.8 |
| 2006/0192496 | A1* | 8/2006 | Yamada | G09G 3/325 315/169.3 |
| 2007/0164948 | A1* | 7/2007 | Kim, II | G09G 3/3611 345/87 |
| 2008/0253074 | A1* | 10/2008 | Shie | H05K 3/361 361/679.02 |
| 2009/0027366 | A1* | 1/2009 | Kim | G09G 3/3685 345/204 |
| 2011/0032687 | A1* | 2/2011 | Song | H05K 3/361 361/803 |
| 2014/0063023 | A1* | 3/2014 | Baek | G09G 1/00 345/501 |
| 2014/0127916 | A1* | 5/2014 | Lee | H05K 1/118 439/74 |
| 2014/0152935 | A1* | 6/2014 | Heo | G02F 1/1339 349/43 |
| 2014/0307396 | A1* | 10/2014 | Lee | H05K 1/028 361/749 |
| 2014/0320779 | A1 | 10/2014 | Noumi | |
| 2014/0327148 | A1 | 11/2014 | Lim et al. | |
| 2015/0028363 | A1* | 1/2015 | Lee | H01L 23/481 257/88 |
| 2015/0036300 | A1* | 2/2015 | Park | H05K 1/147 361/749 |
| 2015/0076531 | A1 | 3/2015 | Kim | |
| 2015/0228218 | A1* | 8/2015 | Shim | G02F 1/13452 345/205 |
| 2016/0066410 | A1* | 3/2016 | Cho | H05K 1/028 361/749 |
| 2016/0088726 | A1* | 3/2016 | Jeon | G02F 1/13452 361/749 |
| 2016/0242295 | A1* | 8/2016 | Kim | H05K 1/189 |

* cited by examiner

PRINTED CIRCUIT BOARD AND DISPLAY DEVICE HAVING THE SAME

CROSS-REFERENCE TO RELATED APPLICATION

This U.S. non-provisional patent application claims priority to, and the benefit of, Korean Patent Application No. 10-2015-0176075, filed on Dec. 10, 2015, in the Korean Patent Office, the content of which is hereby incorporated by reference in its entirety.

BACKGROUND

1. Field of Disclosure

Aspects of the present disclosure relate to a printed circuit board and a display device including the printed circuit board.

2. Description of the Related Art

An electronic device includes two or more electronic components. For instance, the electronic device, such as a mobile phone, a notebook computer, a television set, or the like, includes a display panel for displaying an image, a main circuit board, a flexible printed circuit board, and/or the like.

The two or more electronic components are electrically connected to each other through pad parts of the two or more electronic components. A process (hereinafter, referred to as a bonding process) of electrically connecting the pad parts of the two electronic components includes processes of aligning and coupling the pad parts of the two electronic components. The coupling process is performed using a thermo-compression bonding tool.

As resolution of the display device increases, the number of pads used to transmit and receive signals also increases, which in turn increases a non-display area in each of the display panel and the flexible printed circuit board.

SUMMARY

Aspects of the present disclosure are directed to a printed circuit board having a reduced area in which pads are disposed and a display device including a display panel and the printed circuit board.

Aspects of the present disclosure are directed to a printed circuit board capable of increasing the number of pads disposed in a limited area thereof and a display device including a display panel and the printed circuit board.

Aspects of the present disclosure are directed to a printed circuit board and a display device, which are capable of preventing or substantially preventing a panel line of a display panel from shorting with pads disposed on the printed circuit board.

According to some embodiments of the inventive concept, there is provided a display device including: a printed circuit board, two sides of the printed circuit board extending in first and second directions, respectively, the first and second directions crossing each other, a plurality of pad group areas being defined in the printed circuit board and arranged along the first direction; and a display panel electrically connected to the printed circuit board through the pad group areas, the printed circuit board including: first column pads in each of the pad group areas and arranged along a third direction crossing the first and second directions; and second column pads in each of the pad group areas, arranged along the third direction, and spaced apart from the first column pads, wherein each of the pad group areas includes first, second, and third pad areas sequentially arranged along the second direction, a portion of the first column pads is in the first pad area, an other portion of the first column pads and a portion of the second column pads are in the second pad area, an other portion of the second column pad is in the third pad area, and each of the second column pads has an area greater than an area of each of the first column pads.

In an embodiment, the pad group areas are at one side portion of the printed circuit board along the second direction, and the second column pads are closer to the one side portion of the printed circuit board along the second direction than the first column pads.

In an embodiment, the display panel includes: first column panel pads overlapped with respective ones of the first column pads when viewed in a plan view; and second column panel pads overlapped with respective ones of the second column pads when viewed in a plan view, a portion of the first column panel pads is in the first pad area, an other portion of the first column panel pads and a portion of the second column panel pads are in the second pad area, and the other portion of the second column panel pads is in the third pad area.

In an embodiment, the first column pads cover respective ones of the first column panel pads when viewed in a plan view, and the second column panel pads cover respective ones of the second column pads when viewed in a plan view.

In an embodiment, each of the first column pads has an area greater than an area of each of the first column panel pads, and each of the second column panel pads has an area greater than an area of each of the second column pads.

In an embodiment, each of the first column pads has a same area as each of the second column panel pads, and each of the second column pads has a same area as each of the first column panel pads.

In an embodiment, the display panel further includes: first column panel lines connected to respective ones of the first column panel pads; and second column panel lines connected to respective ones of the second column panel pads.

In an embodiment, the first column panel lines, the second column panel lines, the first column panel pads, and the second column panel pads are at a same layer.

In an embodiment, the first column panel lines are alternately arranged with the second column panel lines along the first direction.

In an embodiment, one of the first column panel lines passes between two second column panel pads adjacent to each other from among the second column panel panels.

In an embodiment, the first column panel lines are not overlapped with respective ones of the second column pads.

In an embodiment, the first column pads and the second column pads are at a same layer.

In an embodiment, the printed circuit board further includes: a base substrate; via lands on one surface of the base substrate; via patterns overlapped with the via lands and penetrating through the base substrate; and a driving circuit chip on an other surface facing the one surface of the base substrate and electrically connected to the first column pads and the second column pads, the first column pads being on the other surface of the base substrate, the second column pads being on the other surface of the base substrate to overlap with respective ones of the via patterns, and the second column pads are electrically connected to the driving circuit chip through respective ones of the via lands and the via patterns.

In an embodiment, the printed circuit board further includes: first lines on the other surface of the base substrate to connect the driving circuit chip and each of the first column pads; and second lines connecting the driving circuit chip and each of the via lands, and the second lines include: second upper lines on the one surface of the base substrate and connected to respective ones of the via lands; second lower lines on the other surface of the base substrate and connected to the driving circuit chip; and second via patterns penetrating through the base substrate to respectively connect the second upper lines to the second lower lines.

In an embodiment, one first column pad of the first column pads has a first shape, an other first column pad of the first column pads has a second shape different from the first shape, one second column pad of the second column pads has a third shape having an area smaller than the first shape, and an other second column pad of the second column pads has a fourth shape different from the third shape and having an area smaller than the second shape.

In an embodiment, each of the first, second, third, and fourth shapes has a substantially quadrangular shape, a length along the first direction of the second shape is less than a length along the first direction of the first shape by a first length, a length along the second direction of the second shape is greater than a length along the second direction of the second shape by the first length, a length along the first direction of the fourth shape is less than a length along the first direction of the third shape by a second length, and a length along the second direction of the fourth shape is greater than a length along the second direction of the third shape by the second length.

In an embodiment, the first column pads in respective ones of the pad group areas sequentially include first- to (n-th)-first column pads, and the first-first column pad or the (n-th)-first column pad has the second shape, and wherein the second column pads in respective ones of the pad group areas sequentially include first- to (n-th)-second column pads, and the first-second column pad or the (n-th)-second column pad has the fourth shape.

According to some embodiments of the inventive concept, there is provided a printed circuit board including: a base substrate, two sides of the base substrate extending in first and second directions, respectively, the first and second directions crossing each other, a plurality of pad group areas being defined in the base substrate and arranged along the first direction; first column pads in each of the pad group areas and arranged along a third direction crossing the first and second directions; and second column pads in each of the pad group areas, arranged along the third direction, and spaced apart from the first column pads, wherein each of the pad group areas includes first, second, and third pad areas sequentially arranged along the second direction, a portion of the first column pads is in the first pad area, an other portion of the first column pads and a portion of the second column pads are in the second pad area, an other portion of the second column pad is in the third pad area, and each of the second column pads has an area greater than an area of each of the first column pads.

In an embodiment, the pad group areas are at one side portion of the printed circuit board along the second direction, and the second column pads are closer to the one side portion of the printed circuit board along the second direction than the first column pads.

According to some embodiments of the inventive concept, there is provided a printed circuit board including: a base substrate, two sides of the base substrate extending in first and second directions, respectively, the first and second directions crossing each other, a plurality of pad group areas being defined in the base substrate and arranged along the first direction; first column pads in each of the pad group areas and arranged along a third direction crossing the first and second directions; and second column pads in each of the pad group areas, arranged along the third direction, and spaced apart from the first column pads, wherein the second column pads are at positions corresponding to positions at which the first column pads move to the second direction by a distance, and each of the second column pads has an area greater than an area of each of the first column pads.

According to the above, the area of each of the printed circuit board and the display panel, in which the pads are disposed, may be reduced.

According to the above, the number of the pads disposed in the limited area of each of the printed circuit board and the display panel may be increased.

According to the above, the panel lines disposed on the display panel may be prevented or substantially prevented from shorting with the pads disposed on the printed circuit board.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

Hereinafter, the present invention will be explained in detail with reference to the accompanying drawings.

Figure 1:
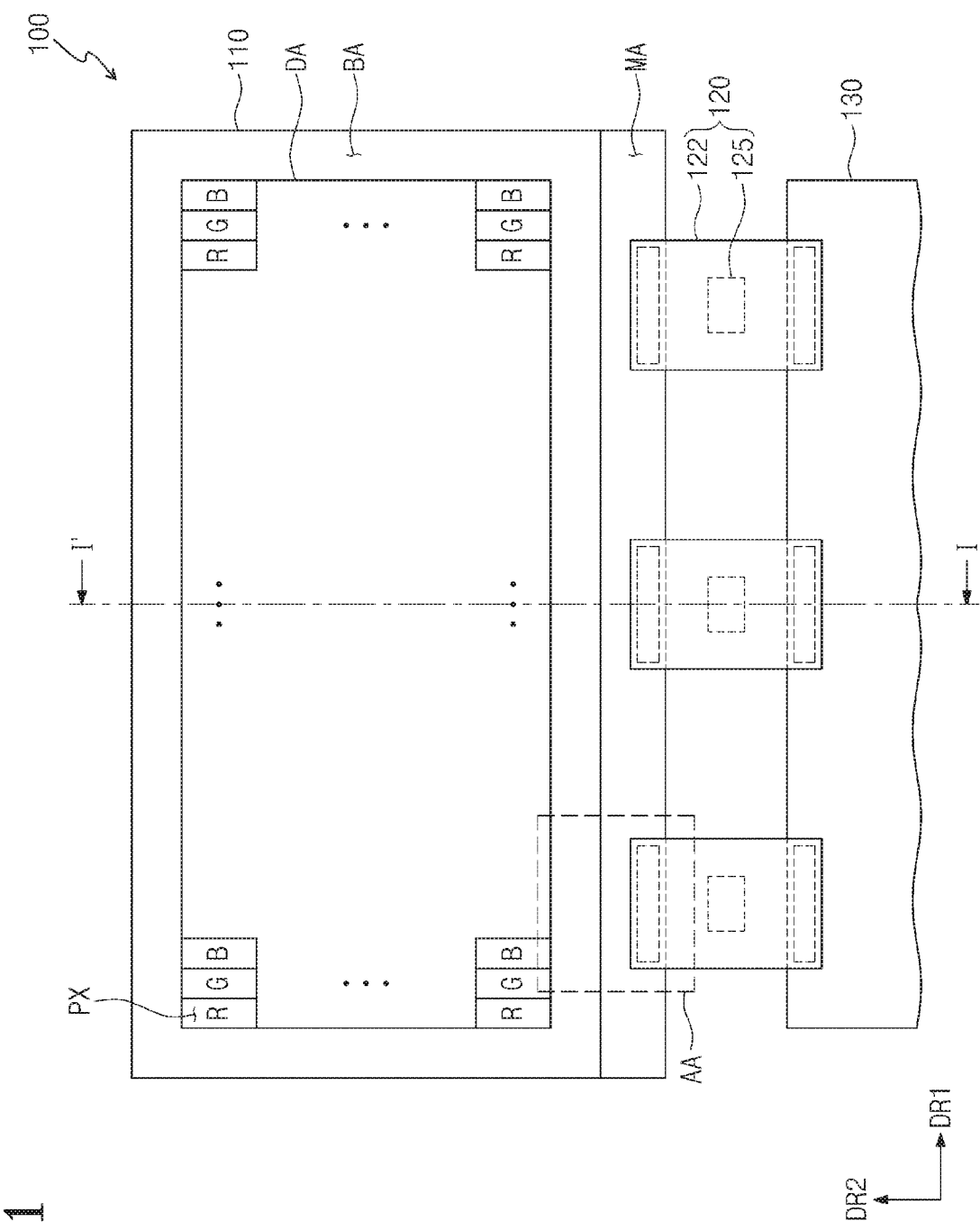
FIG. 1 is a plan view showing a display device according to an exemplary embodiment of the present disclosure.
Figure 2:
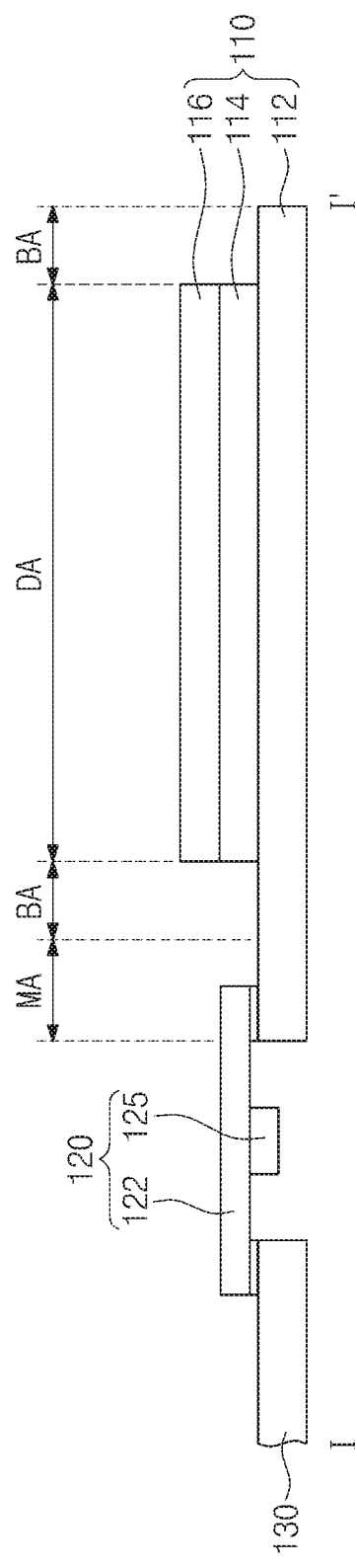
FIG. 2 is a cross-sectional view taken along the line I-I' of FIG. 1.

FIG. 1 is a plan view showing a display device 100 according to an exemplary embodiment of the present disclosure, and FIG. 2 is a cross-sectional view taken along the line I-I' of FIG. 1.

Referring to FIGS. 1 and 2, the display device 100 includes a display panel 110, a flexible printed circuit board 120, and a main driving board 130. The display panel 110, the flexible printed circuit board 120, and the main driving board 130 are electrically connected to each other.

The display panel 110 applies a driving signal to a plurality of pixels PX to display a desired image. The pixels PX are arranged in a matrix form along a first direction DR1 and a second direction DR2 substantially perpendicular to the first direction DR1. In the present exemplary embodiment, the pixels PX include first, second, and third pixels for respectively displaying red, green, and blue colors R, G, and B. In the present exemplary embodiment, the pixels PX may further include a portion of pixels for respectively displaying white, cyan, and magenta colors. The pixels PX are in a region referred to as a display part of the display panel 110.

The display panel 110 may be a liquid crystal display panel, an organic light emitting display panel, or an electrowetting display panel according to the kinds of the pixels PX. In the present exemplary embodiment, the display panel 110 may be the organic light emitting display panel.

When viewed in a plan view, the display panel 110 includes a display area DA in which the pixels PX are arranged, a non-display area BA surrounding the display area DA, and a mounting area MA to which the flexible printed circuit board 120 is coupled. In the present exemplary embodiment, the non-display area BA and the mounting area MA may not be distinct from each other. According to some example, the non-display area BA may be omitted or the mounting area MA may be a part of the non-display area BA.

As shown in FIG. 2, the display panel 110 includes a display substrate 112, a display element layer 114 disposed on the display substrate 112, and a sealing layer 116 disposed on the display element layer 114. The display substrate 112 includes a substrate, and a plurality of insulating layers, a functional layer, and a conductive layer, which are disposed on the substrate. The conductive layer includes gate lines, data lines, and other signal lines. In addition, the conductive layer includes a pad part connected to the lines. The lines may apply driving signals to the pixels PX.

The display element layer 114 may include a plurality of insulating layers, a functional layer, and a conductive layer, which partially form the pixels PX. The functional layer may include an organic light emitting layer. The sealing layer 116 is disposed on the display element layer 114. The sealing layer 116 protects the display element layer 114. The sealing layer 116 may cover a side surface of the display element layer 114.

A black matrix may be disposed in the non-display area BA to block light. A gate driving circuit may be disposed in the non-display area BA to apply gate signals to the pixels PX. In the present exemplary embodiment, a data driving circuit may be further disposed in the non-display area BA. The pad part may be disposed in the mounting area MA to receive signals provided from the flexible printed circuit board 120.

Referring to FIGS. 1 and 2, the flexible printed circuit board 120 includes a flexible line substrate 122 and a driving circuit chip 125. The driving circuit chip 125 is electrically connected to lines of the flexible line substrate 122.

The flexible printed circuit board 120 includes two sides extending in each of first and second directions DR1 and DR2 and adjacent to each other.

In the case where the flexible printed circuit board 120 includes the driving circuit chip 125, the pad part of the display panel 110 includes data pads electrically connected to the data lines and control signal pads electrically connected to control signal lines. The data lines are connected to the pixels PX and the control signal lines are connected to the gate driving circuit. In the present exemplary embodiment, the flexible printed circuit board 120 has a chip-on-film (COF) structure, but it should not be limited thereto or thereby. According to embodiments, the driving circuit chip 125 is mounted in the non-display area BA of the display panel 110 and the flexible printed circuit board 120 includes the flexible line substrate 122.

The main driving board 130 is electrically connected to the display panel 110 through the flexible line substrate 122 to transmit or receive signals to or from the driving circuit chip 125. The main driving board 130 applies image data, control signals, and power voltages to the display panel 110 or the flexible printed circuit board 120. The main driving board 130 includes an active element and a passive element. The main driving board 130 includes the pad part connected to the flexible printed circuit board 120.

Figure 3:
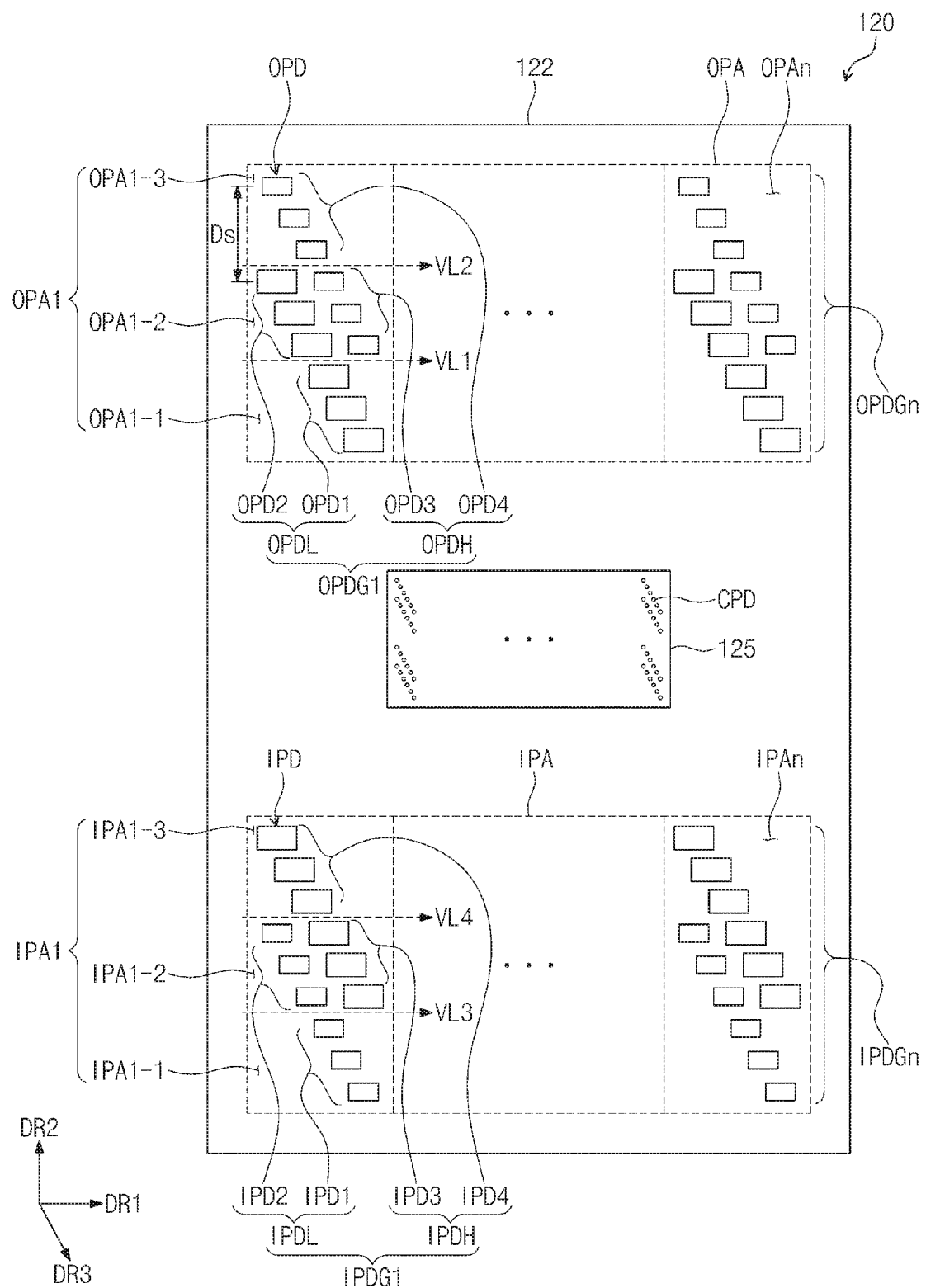
FIG. 3 is a plan view showing a flexible printed circuit board according to an exemplary embodiment of the present disclosure.

FIG. 3 is a plan view showing a flexible printed circuit board according to an exemplary embodiment of the present disclosure.

Referring to FIG. 3, the flexible line substrate 122 includes a plurality of pads OPD, IPD, and CPD and a plurality of lines.

The pads OPD, IPD, and CPD include connection pads CPD connected to connection terminals of the driving circuit chip 125, input pads IPD connected to the main driving board 130, and output pads OPD connected to the display panel 110.

The connection pads CPD are aligned in the second direction DR2 to overlap with both ends of the driving circuit chip 125. Different from the connection pads CPD shown in FIG. 3, the connection pads CPD may be randomly arranged to correspond to connection terminals of the driving circuit chip 125 according to another embodiment.

An input pad area IPA is defined at one end of the flexible line substrate 122 along the second direction DR2, and an output pad area OPA is defined at the other end of the flexible line substrate 122 along the second direction DR2. The input pad area IPA is attached to the mounting area MA of the display panel 110. The output pad area OPA is attached to the main driving board 130.

The input pad area IPA includes a plurality of input pad group areas IPA1 to IPAn. The input pad group areas IPA1 to IPAn are adjacent to each other along the first direction DR1. The input pad group areas IPA1 to IPAn are distinct from each other (e.g., distinguished and/or separated from each other) by imaginary lines extending in the second direction DR2.

The output pad area OPA includes a plurality of input pad group areas OPA1 to OPAn. The output pad group areas OPA1 to OPAn are adjacent to each other along the first direction DR1. The output pad group areas OPA1 to OPAn are distinct from each other (e.g., distinguished and/or separated from each other) by imaginary lines extending in the second direction DR2.

The input pads IPD include a plurality of input pad groups IPDG1 to IPDGn. The input pad groups IPDG1 to IPDGn are disposed in the input pad group areas IPA1 to IPAn, respectively. The input pad groups IPDG1 to IPDGn have the same or substantially the same pad arrangement structure.

The output pads OPD includes a plurality of output pad groups OPDG1 to OPDGn. The output pad groups OPDG1 to OPDGn are disposed in the output pad group areas OPA1 to OPAn, respectively. The output pad groups OPDG1 to OPDGn have the same or substantially the same pad arrangement structure.

Hereinafter, the pad arrangement structure of one output pad group OPDG1 disposed in one output pad group area OPA1 will be described in detail as a representative example.

The output pad group OPDG1 includes a first column output pads OPDL and a second column output pads OPDH.

The first column output pads OPDL are arranged along a third direction DR3 crossing the first and second directions DR1 and DR2. The first to third directions DR1 to DR3 exist in one plane. The first direction DR1 is substantially perpendicular to the second direction DR2, and the third direction DR3 is inclined at an angle of about 45 degrees with respect to each of the first and second directions DR1 and DR2.

The first column output pads OPDL are spaced apart from each other at regular intervals along the third direction DR3. Each of the first column output pads OPDL has a substantially quadrangular shape with two sides extending in each of the first and second directions DR1 and DR2. In the present exemplary embodiment, six first column output pads OPDL are shown in FIG. 3, but the number of the first column output pads OPDL should not be limited to six.

The second column output pads OPDH are arranged along the third direction DR3. The second column output pads OPDH are arranged substantially parallel to the first column output pads OPDL, but they should not be limited thereto or thereby. That is, the directions in which the first and second column output pads OPDL and OPDH are arranged may be changed due to errors in design.

The second column output pads OPDH are spaced apart from each other at regular intervals along the third direction DR3. Each of the second column output pads OPDH has a substantially quadrangular shape with two sides extending in each of the first and second directions DR1 and DR2. The number of the second column output pads OPDH is equal to the number of the first column output pads OPDL. In the present exemplary embodiment, six second column output pads OPDH are shown in FIG. 3, but the number of the second column output pads OPDH should not be limited to six.

The second column output pads OPDH are disposed more adjacent to (e.g., closer to) one side portion of the flexible line substrate 122 along the second direction DR2 than the first column output pads OPDL. That is, the second column output pads OPDH are spaced farther apart from the driving circuit chip 125 along the second direction DR2 than the first column output pads OPDL.

The output pad group area OPA1 includes first, second, and third output pad areas OPA1-1, OPA1-2, and OPA1-3. The first, second, and third output pad areas OPA1-1, OPA1-2, and OPA1-3 are sequentially arranged along the second direction DR2. The first, second, and third output pad areas OPA1-1, OPA1-2, and OPA1-3 are distinct from each other (e.g., distinguished and/or separated from each other) by two imaginary lines VL1 and VL2 extending in the first direction DR1 and spaced apart from each other.

Some pads OPD1 from among the first column output pads OPDL are disposed in the first output pad area OPA1-1. The other pads OPD2 from among the first column output pads OPDL are disposed in the second output pad area OPA1-2. Some pads OPD3 from among the second column output pads OPDH are disposed in the second output pad area OPA1-2. The other pads OPD4 from among the second column output pads OPDH are disposed in the third output pad area OPA1-3.

When viewed in a plan view, the first column output pads OPDL are arranged in a step shape and the second column output pads OPDH are arranged in a step shape in one output pad group area OPA1. The step shape refers to an arrangement in which consecutive elements of a group are offset from one another, by certain amounts, along both the first and second directions. Elements arranged in a step shape may be arranged along the third direction DR3.

In the one output pad group area OPA1, each of the first column output pads OPDL has an area greater than an area of each of the second column output pads OPDL.

In the case where the first column output pads OPDL are shifted along the second direction DR2 by a distance (e.g., a predetermined distance) Ds, each of the first column output pads OPDL covers a corresponding second column output pad OPDH of the second column output pads OPDH.

The input pads IPD may have an arrangement structure similar to that of the output pads OPD. Hereinafter, the pad arrangement structure of one input pad group IPDG1 disposed in one input pad group area IPA1 will be described in detail as a representative example.

The input pad group IPDG1 includes first column input pads IPDL and second column input pads IPDH. The input pad group area IPA1 includes first, second, and third input pad areas IPA1-1, IPA1-2, and IPA1-3. The first, second, and third input pad areas IPA1-1, IPA1-2, and IPA1-3 are sequentially arranged along the second direction DR2. The first, second, and third input pad areas IPA1-1, IPA1-2, and IPA1-3 are distinct from each other (e.g., distinguished or separated from each other) by two imaginary lines VL3 and VL4 extending in the first direction DR1 and spaced apart from each other.

The first column input pads IPDL are disposed more adjacent to (e.g., closer to) the other side portion of the flexible line substrate 122 along the second direction DR2 than the second column input pads IPDH. That is, the first column input pads IPDL are spaced farther apart from the driving circuit chip 125 along the second direction DR2 than the second column input pads IPDH.

Some pads IPD1 from among the first column input pads IPDL are disposed in the first input pad area IPA1-1. The other pads IPD2 from among the first column input pads IPDL are disposed in the second output pad area IPA1-2. Some pads IPD3 from among the second column input pads IPDH are disposed in the second input pad area IPA1-2. The other pads IPD4 from among the second column output pads IPDH are disposed in the third input pad area IPA1-3.

In the one input pad group area IPA1, each of the second column input pads IPDH has an area greater than an area of each of the first column input pads IPDL.

In the case where the second column input pads IPDH are shifted along the second direction DR2 by the distance (e.g., the predetermined distance) Ds, each of the second column input pads IPDH covers a corresponding first column input pad IPDL of the first column input pads IPDH.

According to the present exemplary embodiment, the number of the pads arranged in an area (e.g., a limited area) of the flexible printed circuit board 120 may be increased in accordance with the arrangement shape of the input pads IPD and the output pads OPD.

A portion of the lines connects the connection pads CPD and the input pads IPD and the other portion of the lines connects the connection pads CPD and the output pads OPD. The lines may directly connect the portion of the input pads IPD and the portion of the output pads OPD. This will be described in detail later.

Figure 4:
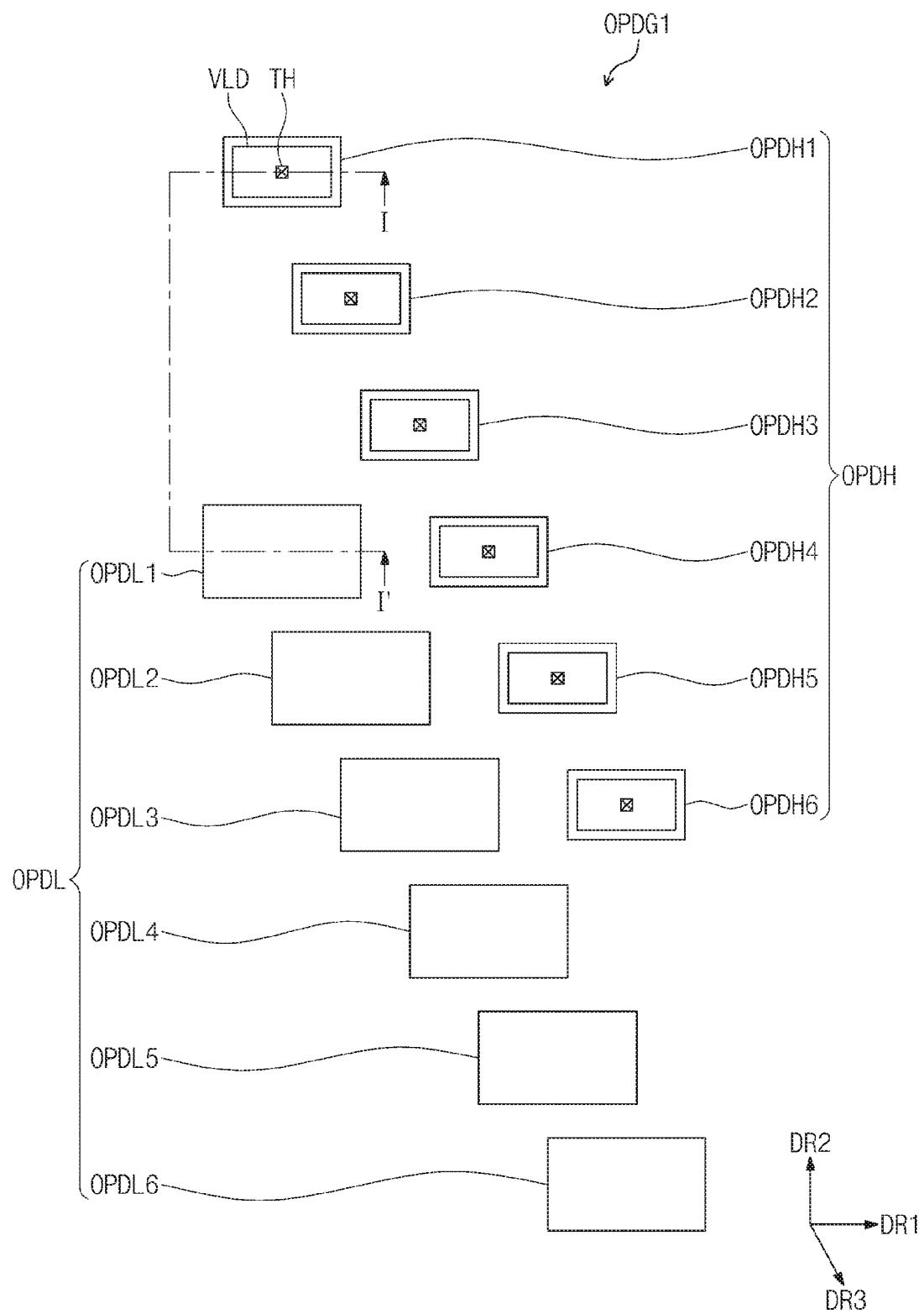
FIG. 4 is an enlarged plan view showing one output pad group illustrated in FIG. 3.
Figure 5:
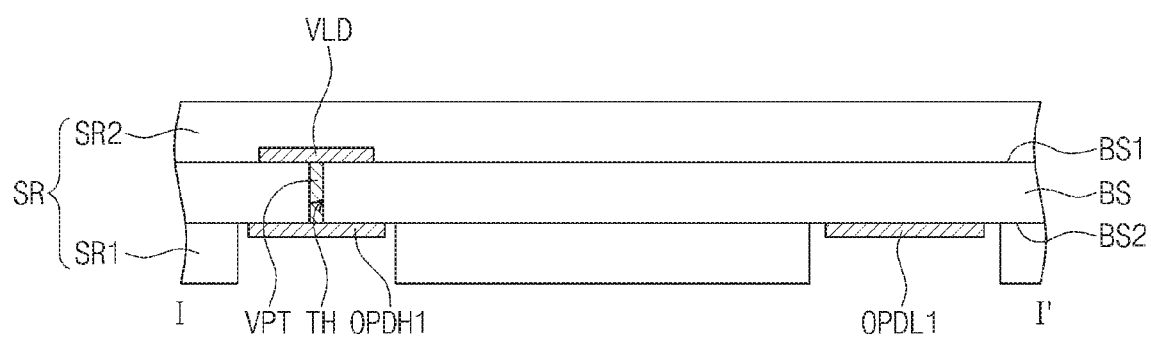
FIG. 5 is a cross-sectional view taken along the line I-I' of FIG. 4.

FIG. 4 is an enlarged plan view showing one output pad group illustrated in FIG. 3, and FIG. 5 is a cross-sectional view taken along the line I-I' of FIG. 4.

FIG. 5 shows one first column output pad OPDL1 and one second column output pad OPDH1. The first column output pads OPDL have the same or substantially the same structure and the second column output pads OPDH have the same or substantially the same structure. Hereinafter, the structure of the first column output pad OPDL1 and the second column output pad OPDH1 will be described in detail.

Referring to FIGS. 4 and 5, the flexible line substrate 122 further includes a base substrate BS, via lands VLD, via patterns VPT, and a solder resist SR.

The base substrate BS is formed of a flexible material, for example, polyimide.

The pads OPD, IPD, and CPD and the lines are disposed on the base substrate BS. The base substrate BS includes one surface BS1 and the other surface BS2 facing the surface BS1. The input pads IPD, the output pads OPD, and the connection pads CPD are disposed on the other surface BS2 of the base substrate BS.

In the present exemplary embodiment, the input pads IPD, the output pads OPD, and the connection pads CPD are disposed at the same layer.

The via lands VLD are disposed on the surface BS1 of the base substrate BS. The via lands VLD are overlapped with respective ones of the second column output pads OPDH. In FIGS. 4 and 5, each of the via lands VLD has an area smaller than that of a corresponding second column output pad OPDH of the second column output pads OPDH, but it should not be limited thereto or thereby. That is, each of the via lands VLD has an area equal to or greater than that of the corresponding second column output pad OPDH of the second column output pads OPDH.

The base substrate BS includes thru-holes (e.g., openings) TH formed therethrough. Each of the thru-holes TH is overlapped with one second column output pad OPDH1 and one via land VLD, which correspond to each other.

The via patterns VPT are disposed in the thru-holes TH. Each of the via patterns VPT makes contact with one second column output pad of the second column output pads OPDH and one via land of the via lands VLD, which are overlapped with each other, through the base substrate BS. Each of the via patterns VPT includes a conductive material to electrically connect one second column output pad of the second column output pads OPDH and one via land of the via lands VLD, which are overlapped with each other.

The solder resist SR includes a first solder resist SR1 and a second solder resist SR2.

The first solder resist SR1 is disposed on the other surface BS2 of the base substrate BS. The first solder resist SR1 covers the lines disposed on the other surface BS2 of the base substrate BS. The first solder resist SR1 includes an opening formed therethrough to expose the input pads IPD and the output pads OPD.

The second solder resist SR2 is disposed on the surface BS1 of the base substrate BS. The second solder resist SR2 covers the lines disposed on the surface BS1 of the base substrate BS.

The lines include input lines and output lines. The input lines connect the input pads IPD and the driving circuit chip 125. The output lines connect the output pads OPD and the driving circuit chip 125. As the input lines have the similar structure to the output lines, hereinafter, the structure of the output lines will be described in detail.

The output lines include first output lines and second output lines. The second output lines include second upper output lines, second lower output lines, and second via patterns.

Hereinafter, the first output lines and the second lower output lines will be described with reference to FIGS. 6 and 7, and the second output lines will be described with reference to FIGS. 6 to 9.

Figure 6:
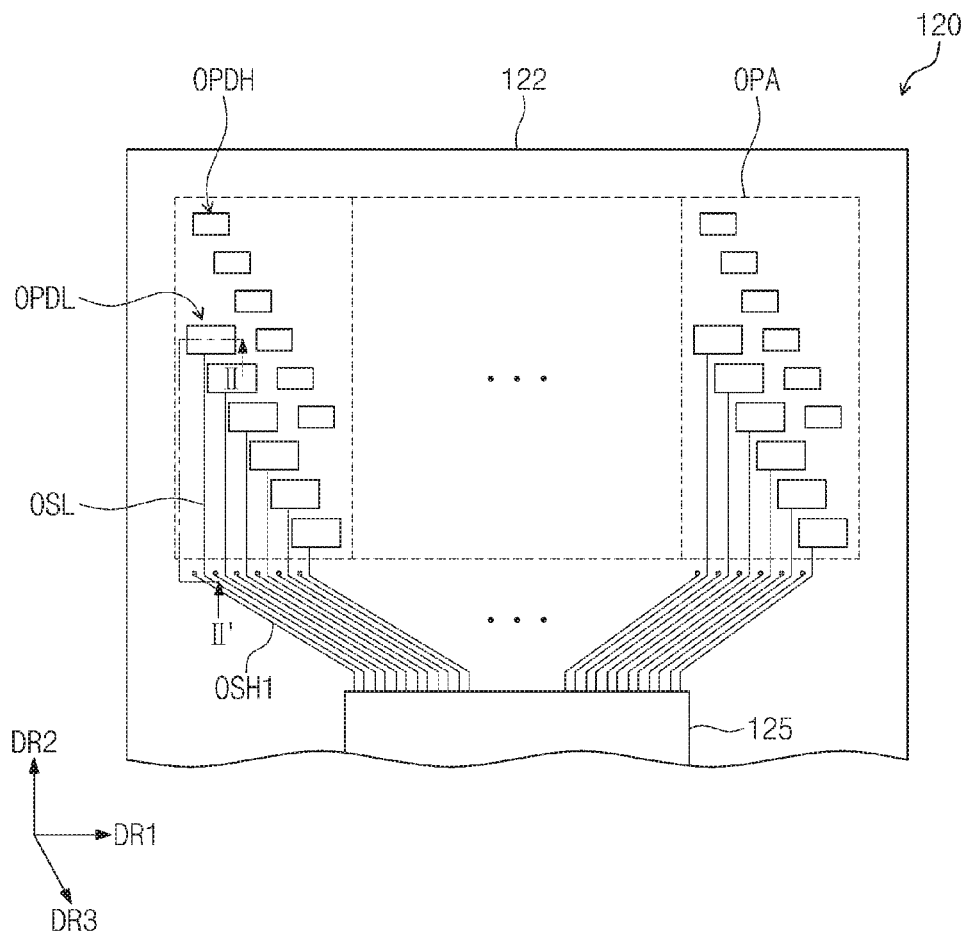
FIG. 6 is a plan view showing a portion of a flexible printed circuit board on which first output lines and second lower output lines are disposed.
Figure 7:
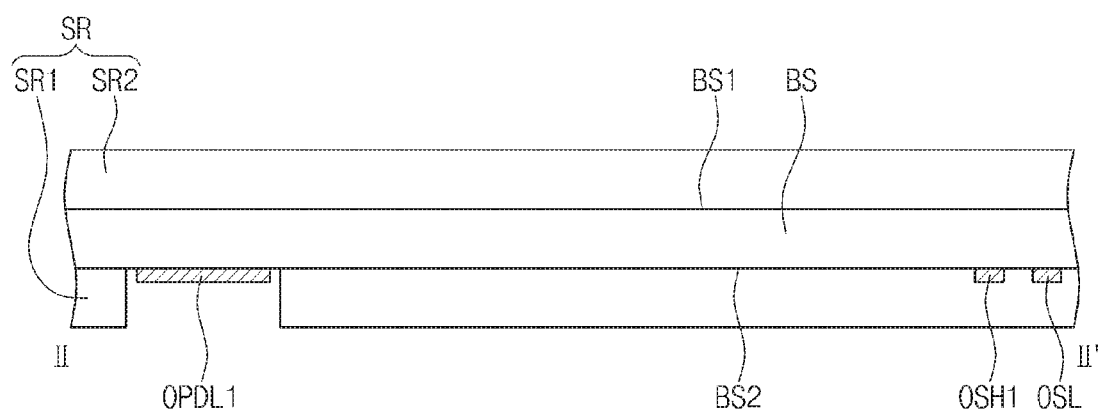
FIG. 7 is a cross-sectional view taken along the line II-II' of FIG. 6.

FIG. 6 is a plan view showing a portion of a flexible printed circuit board on which first output lines and second lower output lines are disposed, and FIG. 7 is a cross-sectional view taken along the line II-II' of FIG. 6.

Referring to FIGS. 6 and 7, the first output lines OSL connect the driving circuit chip 125 and each of the first column output pads OPDL. The first output lines OSL are disposed on the other surface BS2 of the base substrate BS. The first output lines OSL are disposed at the same layer as the first column output pads OPDL.

The second lower output lines OSH1 are connected to the driving circuit chip 125 (e.g., refer to FIG. 3). The second lower output lines OSH1 are disposed on the other surface BS2 of the base substrate BS. The second lower output lines OSH1 are spaced apart from the first output lines OSL and disposed at the same layer as the first output lines OSL.

Figure 8:
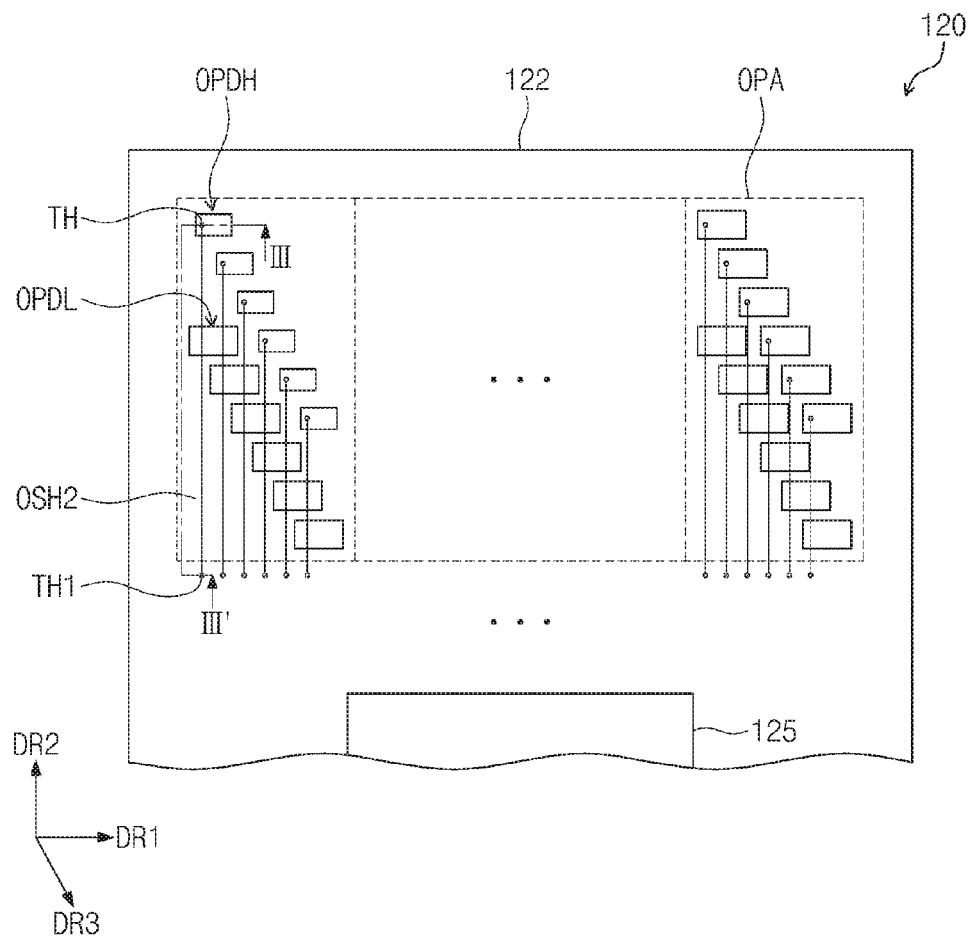
FIG. 8 is a plan view showing a portion of a flexible printed circuit board on which second upper output lines are disposed.
Figure 9:
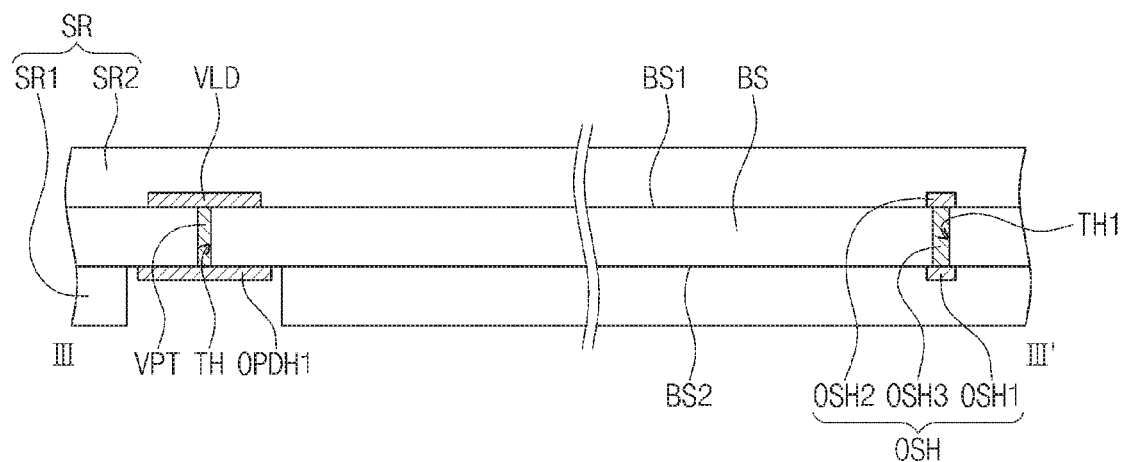
FIG. 9 is a cross-sectional view taken along the line III-III' of FIG. 8.

FIG. 8 is a plan view showing a portion of a flexible printed circuit board on which second upper output lines are disposed, and FIG. 9 is a cross-sectional view taken along the line III-III' of FIG. 8.

Referring to FIGS. 8 and 9, second upper output lines OSH2 are respectively connected to the via lands VLD. The second upper output lines OSH2 are disposed on the surface BS1 of the base substrate BS. The second upper output lines OSH2 are disposed at the same layer as the via lands VLD.

Second via patterns OSH3 are respectively disposed at second via thru-holes (e.g., second via openings) TH1 formed through the base substrate BS. The second via patterns OSH3 connect the second lower output lines OSH1 and the second upper output lines OSH2. Each of the second via patterns OSH3 is disposed to overlap with a corresponding second lower output line from among the second lower output lines OSH1 and a corresponding second upper output line from among the second upper output lines OSH2.

The second column output pads OPDH are electrically connected to the driving circuit chip 125 through the via lands VLD, the via patterns VPT, the second upper output lines OSH2, the second via patterns OSH3, and the second lower output lines OSH1.

Figure 10:
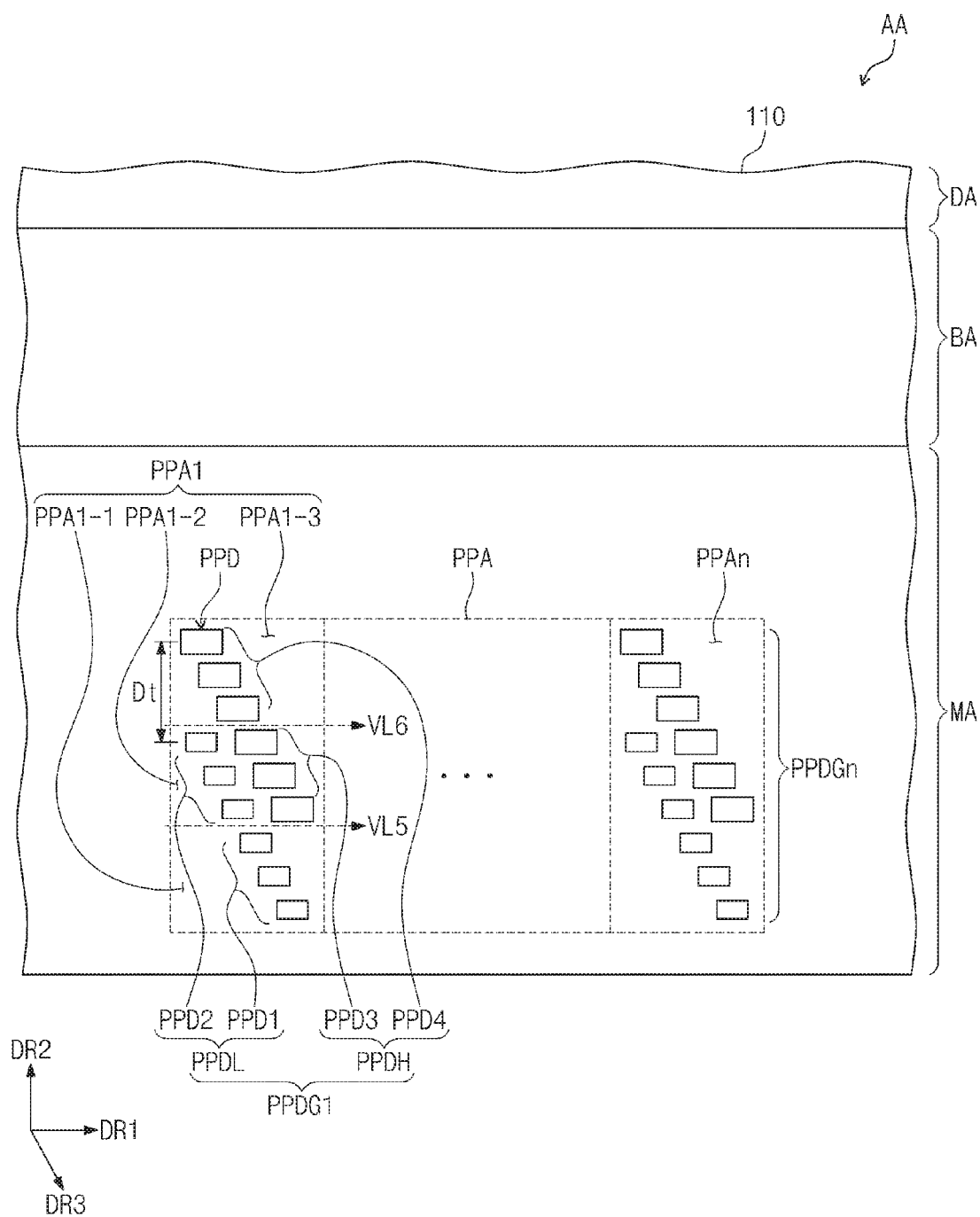
FIG. 10 is a plan view showing panel pads disposed on a display panel corresponding to the area AA of FIG. 1.

FIG. 10 is a plan view showing panel pads disposed on a display panel corresponding to the area AA of FIG. 1.

Referring to FIGS. 3 and 10, the display panel 110 includes panel pads PPD electrically connected to the output pads OPD of the flexible printed circuit board 120. Each of the panel pads PPD may be, but is not limited to, a data pad or a control signal pad.

A panel pad area PPA may be defined in the mounting area MA. The panel pad area PPA may be overlapped with the output pad area OPA when the display panel 110 is coupled to the flexible printed circuit board 120.

The panel pad area PPA includes a plurality of panel pad group areas PPA1 to PPAn. The panel pad group areas PPA1 to PPAn are disposed adjacent to each other along the first direction DR1. The panel pad group areas PPA1 to PPAn are distinct from each other (e.g., distinguished or separated from each other) by imaginary lines extending in the second direction DR2.

The panel pads PPD include a plurality of panel pad groups PPDG1 to PPDGn. The panel pad groups PPDG1 to PPDGn are respectively disposed in the panel pad group areas PPA1 to PPAn. The panel pad groups PPDG1 to PPDGn have the same or substantially the same pad arrangement structure with each other.

Hereinafter, the pad arrangement structure of one panel pad group PPDG1 disposed in one panel pad group area PPA1 will be described in detail.

The panel pad group PPDG1 includes first column panel pads PPDL and second column panel pads PPDH.

The first column panel pads PPDL are arranged along the third direction DR3. The first column panel pads PPDL are spaced apart from each other at regular intervals along the third direction DR3. Each of the first column panel pads PPDL has a substantially quadrangular shape defined by two sides extending in each of the first and second directions DR1 and DR2. The number of the first column panel pads PPDL is equal to the number of the first column output pads OPDL of the flexible printed circuit board 120.

The second column panel pads PPDH are arranged along the third direction DR3. The second column panel pads PPDH are arranged to be substantially parallel to the first column panel pads PPDL, but they should not be limited thereto or thereby. That is, the directions in which the first and second column output pads OPDH and OPDL extend may be changed due to errors in design. The second column panel pads PPDH are spaced apart from each other at regular intervals along the third direction DR3. Each of the second column panel pads PPDH has a substantially quadrangular shape defined by two sides extending in each of the first and second directions DR1 and DR2. The number of the second column panel pads PPDH is equal to the number of the first column panel pads PPDL.

The second column panel pads PPDH are disposed more adjacent to (e.g., closer to) the display area DA along the second direction DR2 than the first column panel pads PPDL.

The panel pad group area PPA1 includes first, second, and third panel pad areas PPA1-1, PPA1-2, and PPA1-3. The first, second, and third panel pad areas PPA1-1, PPA1-2, and PPA1-3 are sequentially arranged along the second direction DR2. The first, second, and third panel pad areas PPA1-1, PPA1-2, and PPA1-3 are distinct from each other (e.g., distinguished or separated from each other) by two imaginary lines VL5 and VL6 extending along the first direction DR1 and spaced apart from each other.

Some pads PPD1 from among the first column panel pads PPDL are disposed in the first panel pad area PPA1-1. The other pads PPD2 from among the first column panel pads PPDL are disposed in the second panel pad area PPA1-2. Some pads PPD3 from among the second column panel pads PPDH are disposed in the second panel pad area PPA1-2. The other pads PPD4 from among the second column panel pads PPDH are disposed in the third panel pad area PPA1-3.

When viewed in a plan view, the first column panel pads PPDL are arranged in a step shape and the second column panel pads PPDH are arranged in a step shape in one panel pad group area PPA1.

In the one panel pad group area PPA1, each of the second column panel pads PPDH has an area greater than an area of each of the first column panel pads PPDL.

In the case where the first column panel pads PPDL are shifted along the second direction DR2 by a distance (e.g., a predetermined distance) Dt, each of the first column panel pads PPDL is covered by (e.g., overlapped with) a corresponding second column panel pad PPDH.

According to the present exemplary embodiment, the number of the pads arranged in the area (e.g., the limited area) of the display panel 110 may be increased in accordance with the arrangement shape of the panel pads PPD and the output pads OPD. Accordingly, the mounting area MA of the display panel 110 may be reduced.

Figure 11:
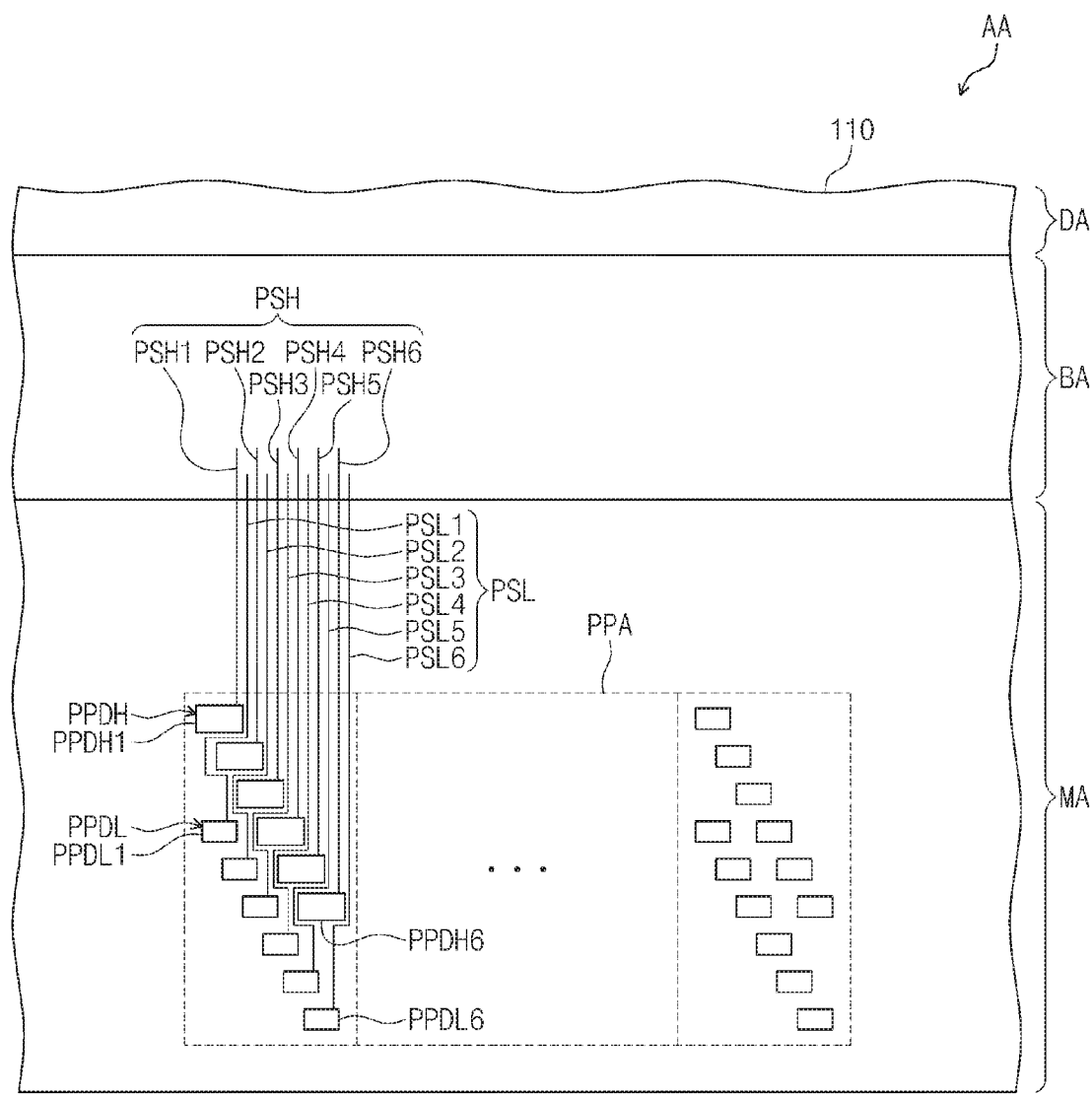
FIG. 11 is a plan view showing panel pads and panel lines disposed on a display panel corresponding to the area AA of FIG. 1.

FIG. 11 is a plan view showing panel pads and panel lines disposed on a display panel corresponding to the area AA of FIG. 1.

Referring to FIGS. 10 and 11, the display panel 110 includes panel lines PSL and PSH. The panel lines PSL and PSH include gate lines, data lines, or other signal lines. The panel lines PSL and PSH include first column panel lines PSL connected to the first column panel pads PPDL and second column panel lines PSH connected to the second column panel pads PPDH.

The first column panel lines PSL1 to PSL6 are alternately arranged with the second column panel lines PSH1 to PSH6 along the first direction DR1.

The second column panel pads PPDH include first- to sixth-second column panel pads PPDH1 to PPDH6. The first-second panel pad PPDH1 is disposed most adjacent to (e.g., closest to) the display area DA from among the second column panel pads PPDH and the sixth-second column panel pad PPDH6 is farthest spaced apart from the display area DA from among the second column panel pads PPDH. The second column panel lines PSH1 to PSH6 are respectively connected to the first- to sixth-second column panel pads PPDH1 to PPDH6.

The first column panel pads PPDL include first- to sixth-first column panel pad PPDL1 to PPDL6. The first-first panel pad PPDL1 is disposed most adjacent to (e.g., closest to) the display area DA from among the first column panel pads PPDL and the sixth-first column panel pad PPDL6 is farthest spaced apart from the display area DA from among the first column panel pads PPDL. The first column panel lines PSL1 to PSL6 are respectively connected to the first- to sixth-first column panel pads PPDL1 to PPDL6.

The first-first column panel line PSL1 passes through between (e.g., between) the first-second column panel pad PPDH1 and the second-second column panel pad. The second-first column panel line PSL2 passes through between the second- and third-second column panel pads. The third-first column panel line PSL3 passes through between the third- and fourth-second column panel pads. The fourth-first column panel line PSL4 passes through between the fourth- and fifth-second column panel pads. The fifth-first column panel line PSL5 passes through between the fifth- and sixth-second column panel pads.

Figure 12:
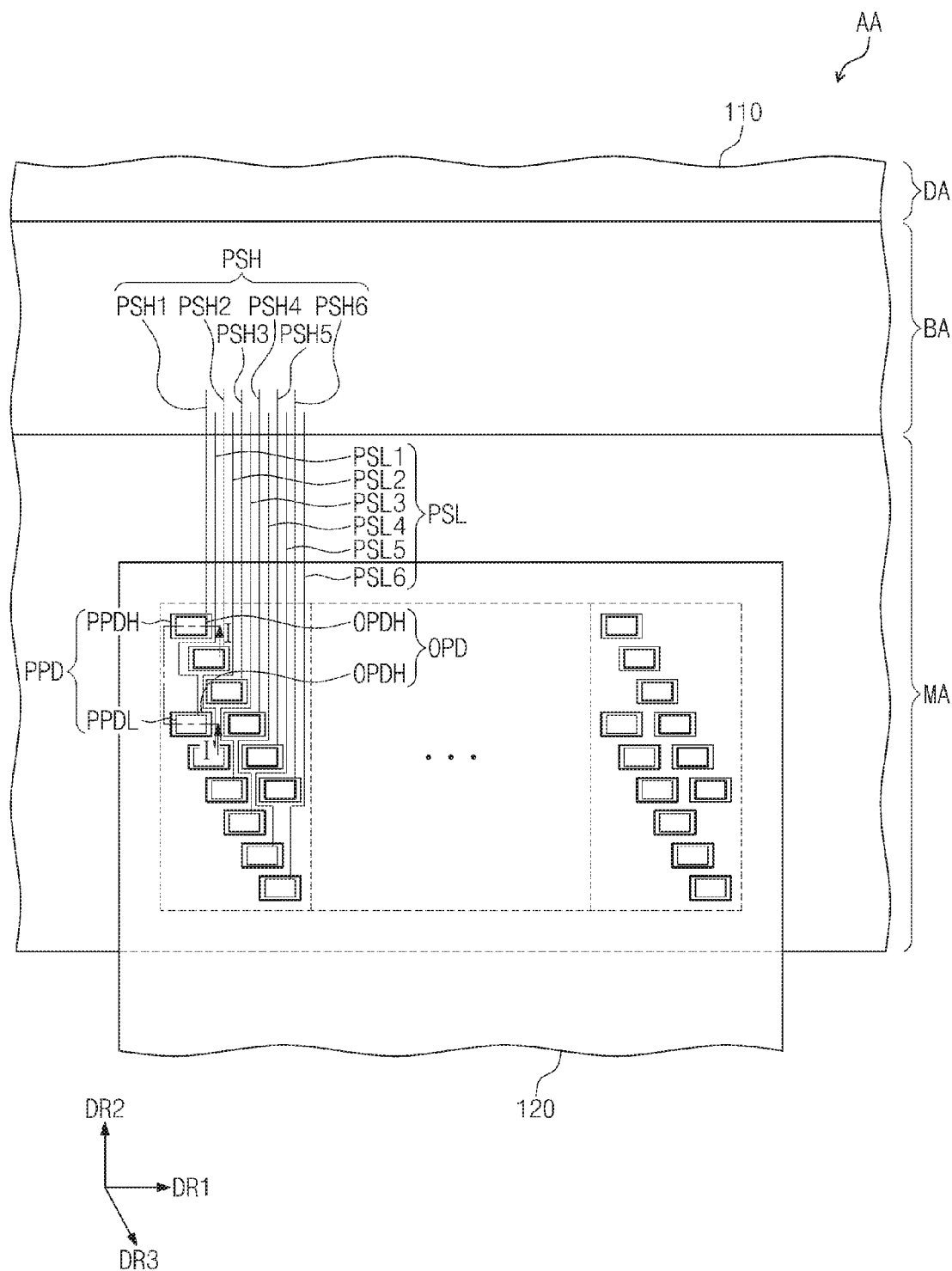
FIG. 12 is an enlarged plan view showing the area AA of FIG. 1 when the display panel is coupled to the flexible printed circuit board.
Figure 13:
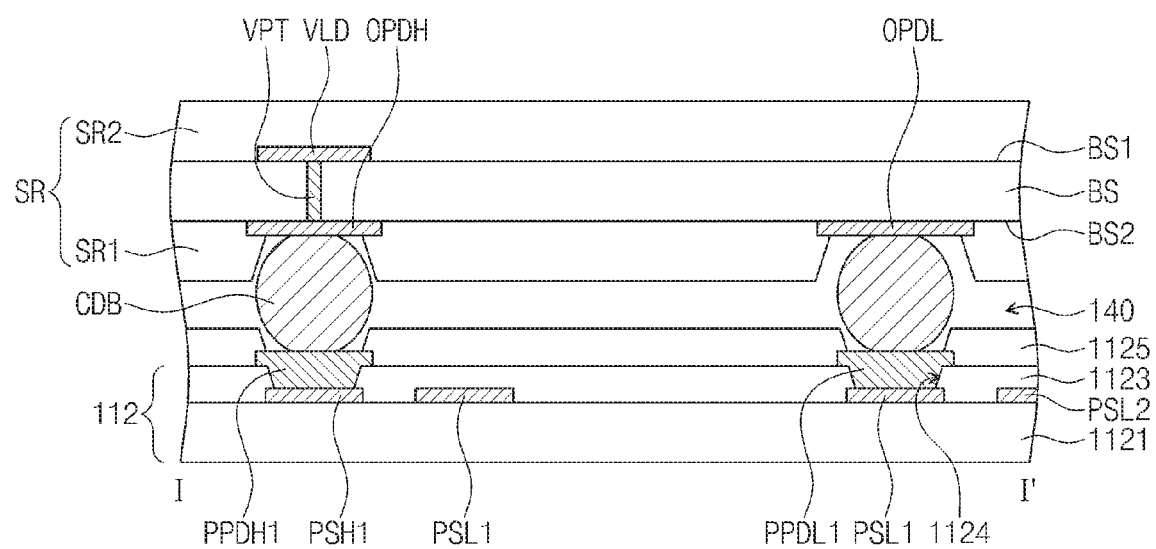
FIG. 13 is a cross-sectional view taken along the line I-I' of FIG. 12.

FIG. 12 is an enlarged plan view showing the area AA of FIG. 1 when the display panel is coupled to the flexible printed circuit board, and FIG. 13 is a cross-sectional view taken along the line I-I' of FIG. 12.

Referring to FIGS. 11 to 13, the first column output pads OPDL cover respective ones of the first column panel pads PPDL, when viewed in a plan view. Each of the first column output pads OPDL has an area greater than an area of each of the first column panel pads PPDL.

When viewed in a plan view, the second column panel pads PPDH cover respective ones of the second column output pads OPDH. Each of the second column panel pads PPDH has an area greater than an area of each of the second column output pads OPDH.

However, when the display panel 110 and the flexible printed circuit board 120 are bonded to each other, portions of the output pads OPD may not be overlapped with portions of the panel pads PPD due to the errors in process.

Each of the first column output pads OPDL has the same or substantially the same area as each of the second column panel pads PPDH. Each of the second column output pads OPDH has the same or substantially the same area as each of the first column panel pads PPDL.

The display substrate 112 of the display panel 110 includes a substrate 1121. The panel lines PSL and PSH are disposed on the substrate. A first insulating layer 1123 is disposed on the panel lines PSL and PSH. The first insulating layer 1123 includes various layers, such as, a barrier layer, a passivation layer, and/or the like.

The panel pads PPD are disposed on the first insulating layer 1123 and connected to the panel lines PSL and PSH through thru-holes (e.g., openings) 1124 formed through the first insulating layer 1123. The first column panel pads PPDL are connected to the first column panel lines PSL and the second column panel pads PPDH are connected to the second column panel lines PSH.

A second insulating layer 1125 is disposed on the first insulating layer 1123. The second insulating layer 1125 exposes the panel pads PPD.

The display device 100 may further include a conductive adhesive film 140 disposed between the display panel 110 and the flexible printed circuit board 120. The output pads OPDH and OPDL may be electrically connected to the panel pads PPDH and PPDL through the conductive adhesive film 140. The first column panel pads PPDL are electrically connected to respective ones of the first column output pads OPDL, through a plurality of conductive balls CDB included in the conductive adhesive film 140, and the second column panel pads PPDH are electrically connected to respective ones of the second column output pads OPDH, through the conductive balls CDB included in the conductive adhesive film 140.

When viewed in a plan view, the first column panel lines PSL may not be overlapped with the second column output pads OPDH.

One first column panel line from among the first column panel lines PSL is disposed between two second column panel lines PSH adjacent to each other from among the second column panel lines PSH. Therefore, the panel line disposed most adjacent to (e.g., closest to) each of the first column panel lines PSL along the first direction DR1 may be the first column panel lines PSL. The first and second insulating layers 1123 and 1125 may be damaged by the conductive balls CDB when the display panel 110 and the flexible printed circuit board 120 are bonded to each other. In the case where the second column output pads OPDH are overlapped with the first column panel lines PSL when viewed in a plan view, the second column output pads OPDH may be electrically connected to the first column panel lines PSL through opening formed by the damaged first and second insulating layers 1123 and 1125. This causes defects in the display device 100.

According to the display device 100, because the second column output pads OPDH are not overlapped with the first column panel lines PSL when viewed in a plan view, the second column output pads OPDH may be prevented or substantially prevented from being electrically connected to the first column panel lines PSL. In addition, when the areas of the panel pads PPDL and PPDH and the output pads OPDL and OPDH are controlled, the area, in which the first column panel pads PPDL are overlapped with the first column output pads OPDL, may be set to be equal to the area in which the second column panel pads PPDH are overlapped with the second column panel pads OPDH.

Figure 14:
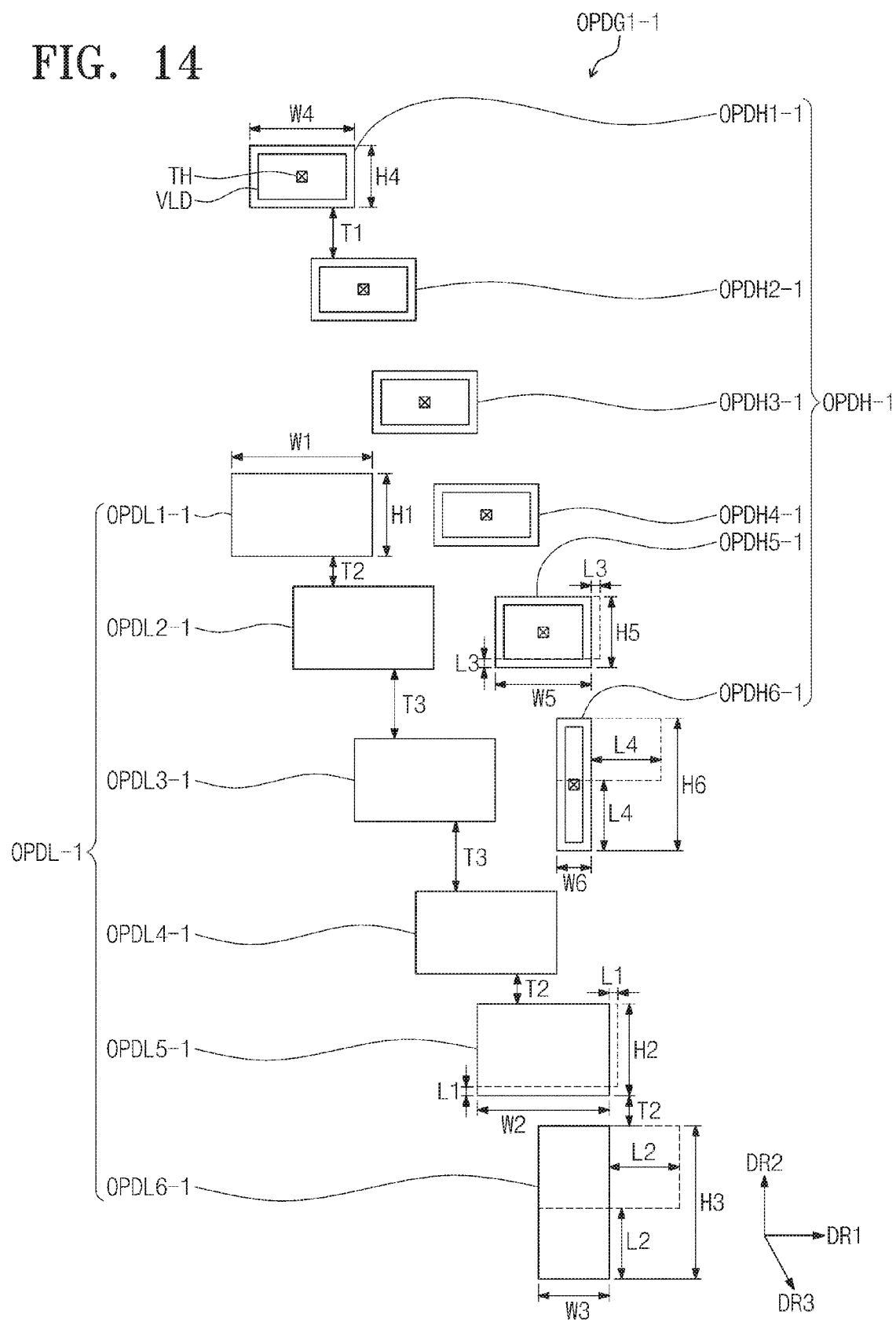
FIG. 14 is a plan view showing one output pad group according to another exemplary embodiment of the present disclosure.

FIG. 14 is a plan view showing one output pad group according to another exemplary embodiment of the present disclosure.

When compared with the output pad group OPDG1 shown in FIG. 3, an output pad group OPDG1-1 shown in FIG. 14 includes pads having different plane shapes from each other.

The output pad group OPDG1-1 includes first column output pads OPDL-1 and second column output pads OPDH-1. The first column output pads OPDL-1 include first- to sixth-first column output pads OPDL1-1 to OPDL6-1. The second column output pads OPDH-1 include first- to sixth-second column output pads OPDH1-1 to OPDH6-1.

Each of the first column output pads OPDL-1 has an area greater than an area of each of the second column output pads OPDH-1, the first column output pads OPDL-1 facing the second column output pads OPDH-1 in the second direction DR2. In the case where the first column output pads OPDL-1 are shifted along the second direction DR2 by a distance (e.g., a predetermined distance), the first column output pads OPDL-1 cover respective ones of the second column output pads OPDH-1.

In the present exemplary embodiment, the first column output pads OPDL-1 have first, second, and third shapes, and the second column output pads OPDH-1 have fourth, fifth, and sixth shapes.

The first- to fourth-first column output pads OPDL1-1 to OPDL4-1 have the first shape, the fifth-first column output pad OPDL5-1 has the second shape, and the sixth-first column output pad OPDL6-1 has the third shape. The first- to fourth-second column output pads OPDH1-1 to OPDH4-1 have the fourth shape, the fifth-second column output pad OPDH5-1 has the fifth shape, and the sixth-second column output pad OPDH6-1 has the sixth shape.

The first shape has a first width W1 along the first direction DR1 and a first height H1 along the second direction DR2. The second shape has a second width W2 along the first direction DR1 and a second height H2 along the second direction DR2. The second width W2 is less than the first width W1 by a first length L1. The second height H2 is greater than the first height H1 by the first length L1.

The third shape has a third width W2 along the first direction DR1 and a third height H3 along the second direction DR2. The third width W3 is less than the first width W1 by a second length L2. The third height H3 is greater than the first height H1 by a second length L2.

The fourth shape has a fourth width W4 along the first direction DR1 and a fourth height H4 along the second direction DR2. The fifth shape has a fifth width W5 along the first direction DR1 and a fifth height H5 along the second direction DR2. The fifth width W5 is less than the fourth width W4 by a third length L3. The fifth height H5 is greater than the fourth height H4 by the third length L3.

The sixth shape has a sixth width W6 along the first direction DR1 and a sixth height H6 along the second direction DR2. The sixth width W6 is less than the fourth width W4 by a fourth length L4. The sixth height H6 is greater than the fourth height H4 by a fourth length L4.

The second column output pads OPDH-1 are spaced apart from each other along the second direction DR2 by a first interval T1.

The first column output pads OPDL-1 are spaced apart from each other by different intervals. In detail, the first- and second-first column output pads OPDL1-1 and OPDL2-1 are spaced apart from each other by a second interval T2 along the second direction DR2, and the second- and third-first column output pads OPDL2-1 and OPDL3-1 are spaced apart from each other by a third interval T3 along the second direction DR2. The third- and fourth-first column output pads OPDL3-1 and OPDL4-1 are spaced apart from each other by the third interval T3 along the second direction DR2. The fourth- and fifth-first column output pads OPDL4-1 and OPDL5-1 are spaced apart from each other by the second interval T2 along the second direction DR2. The fifth- and sixth-first column output pads OPDL5-1 and OPDL6-1 are spaced apart from each other by the second interval T2 along the second direction DR2. The first interval T1 may be different from the second interval T2.

The output pad group OPDG1-1 shown in FIG. 14 may have a relatively reduced width along the first direction DR1 when compared with the output pad group OPDG1 shown in FIG. 3. Thus, according to the display device 100, the number of the output pad groups arranged along the first direction DR1 on the flexible printed circuit board 120 may be increased.

Figure 15:
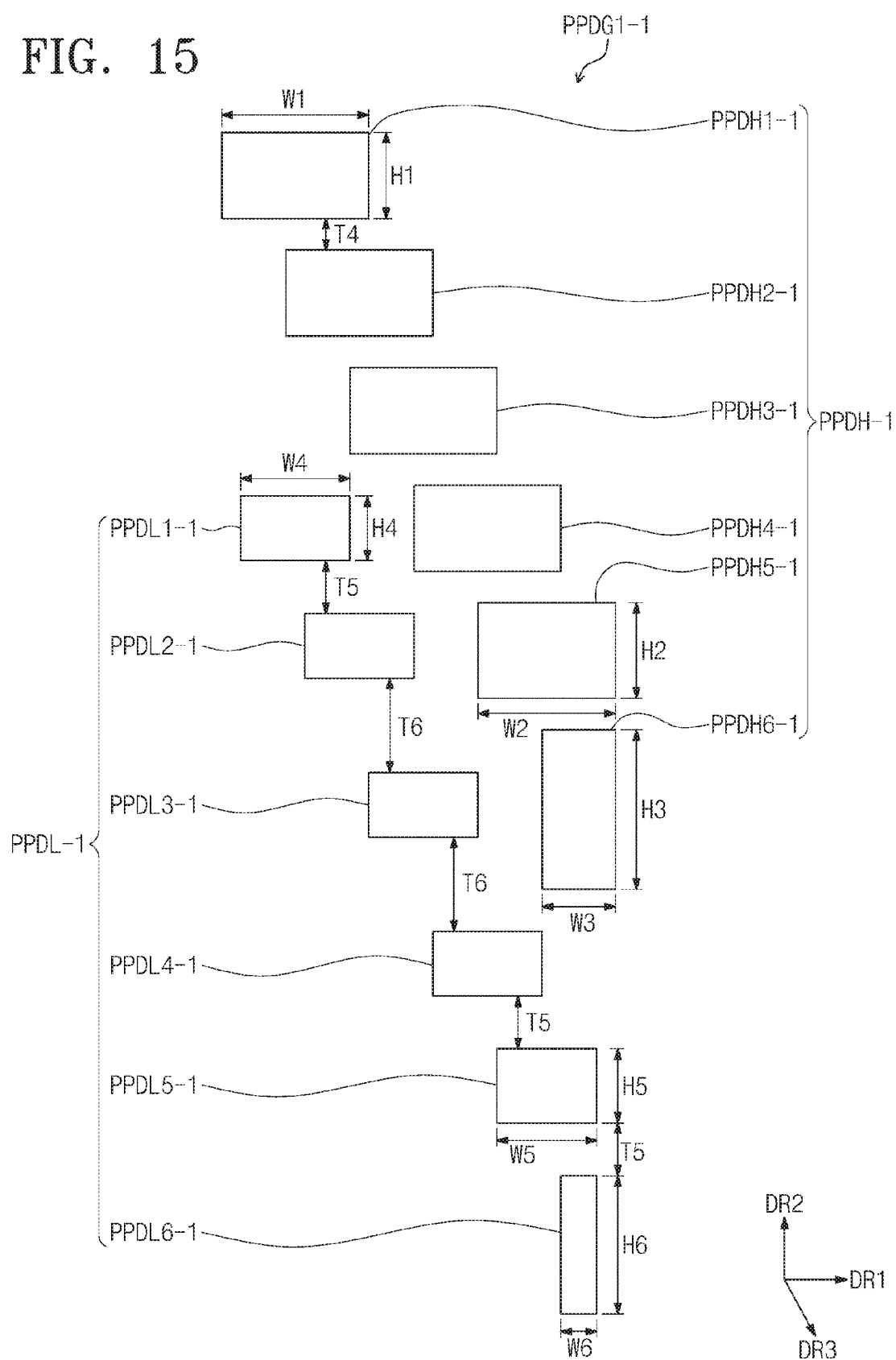
FIG. 15 is a plan view showing panel pads corresponding to the output pad group shown in FIG. 14.

FIG. 15 is a plan view showing panel pads corresponding to the output pad group shown in FIG. 14.

When compared with the panel pad group PPDG1 shown in FIG. 10, a panel pad group PPDG1-1 shown in FIG. 15 includes pads having different plane shapes from each other.

The panel pad group PPDG-1 includes first column panel pads PPDL-1 and second column panel pads PPDH-1. The first column panel pads PPDL-1 include first-to sixth-first column panel pads PPDL1-1 to PPDL6-1. The second column panel pads PPDH-1 include first- to sixth-second column panel pads PPDH1-1 to PPDH6-1.

Each of the first column panel pads PPDL-1 has an area greater than an area of each of the second column panel pads PPDH-1, the first column pads PPDL-1 facing the second column pads PPDH-1 in the second direction DR2. In the case where the first column panel pads PPDL-1 are shifted along the second direction DR2 by a distance (e.g., a predetermined distance), the first column panel pads PPDL-1 cover respective ones of the second column panel pads PPDH-1.

In the present exemplary embodiment, the first column panel pads PPDL-1 have fourth, fifth, and sixth shapes, and the second column panel pads PPDH-1 have first, second, and third shapes.

The first- to fourth-first column panel pads PPDL1-1 to PPDL4-1 have the fourth shape, the fifth-first column panel pad PPDL5-1 has the fifth shape, and the sixth-first column panel pad PPDL6-1 has the sixth shape. The first- to fourth-second column panel pads PPDH1-1 to PPDH4-1 have the fourth shape, the fifth-second column panel pad PPDH5-1 has the fifth shape, and the sixth-second column panel pad PPDH6-1 has the sixth shape.

The second column panel pads PPDH-1 are spaced apart from each other along the second direction DR2 by a fourth interval T4.

The first column panel pads PPDL-1 are spaced apart from each other by different intervals. In detail, the first- and second-first column panel pads PPDL1-1 and PPDL2-1 are spaced apart from each other by a fifth interval T5 along the second direction DR2, and the second- and third-first column panel pads PPDL2-1 and PPDL3-1 are spaced apart from each other by a sixth interval T6 along the second direction DR2. The third- and fourth-first column panel pads PPDL3-1 and PPDL4-1 are spaced apart from each other by the sixth interval T6 along the second direction DR2. The fourth- and fifth-first column panel pads PPDL4-1 and PPDL5-1 are spaced apart from each other by the fifth interval T5 along the second direction DR2. The fifth- and sixth-first column panel pads PPDL5-1 and PPDL6-1 are spaced apart from each other by the fifth interval T5 along the second direction DR2. The fourth interval T4 may be different from the fifth interval T5.

The panel pad group PPDG1-1 shown in FIG. 15 may have a relatively reduced width along the first direction DR1 when compared with the panel pad group PPDG1 shown in FIG. 10. Thus, according to the display device 100, the number of the output pad groups arranged along the first direction DR1 in the mounting area MA of the display panel 110 may be increased.

Figure 16:
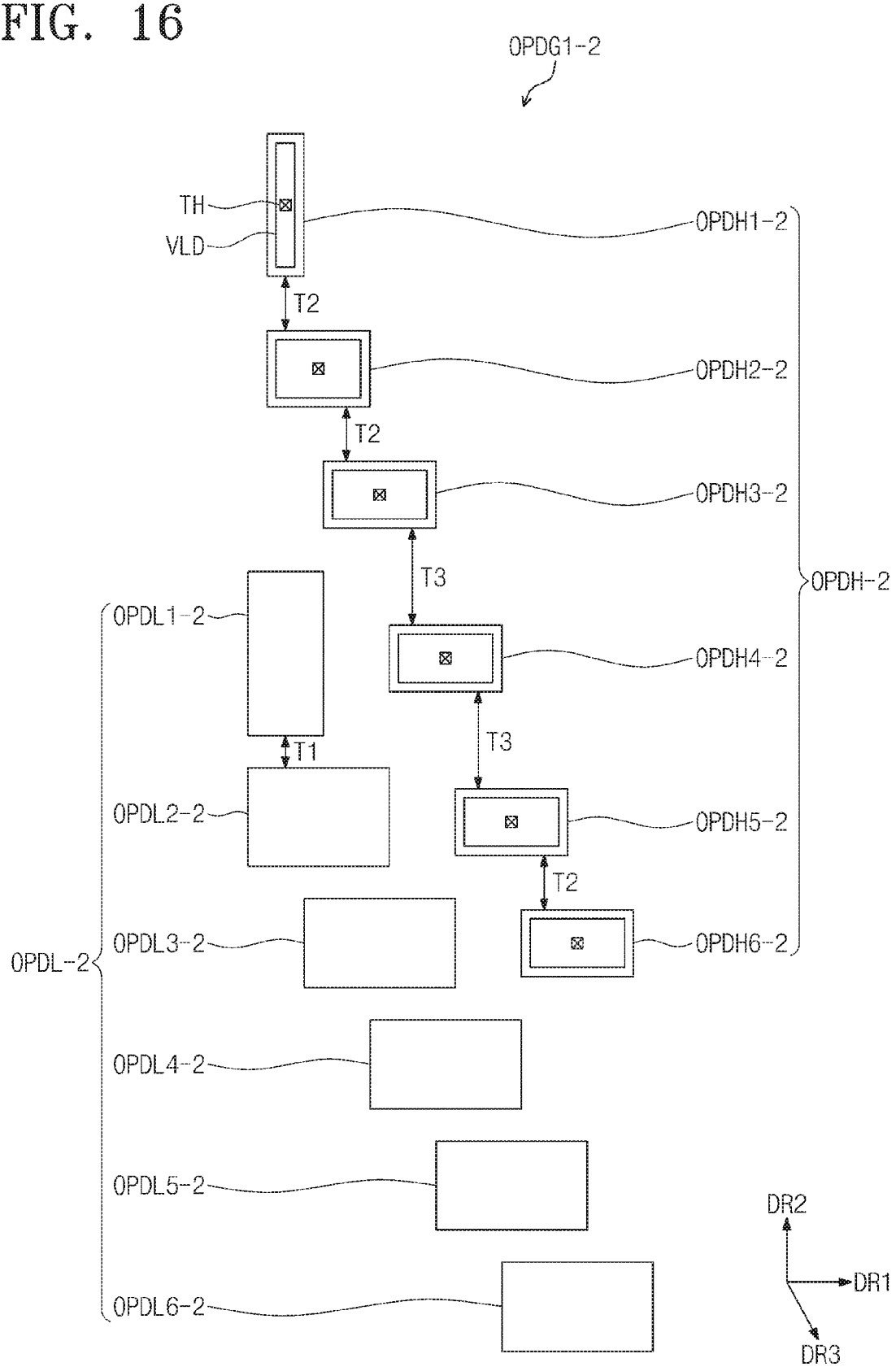
FIG. 16 is a plan view showing one output pad group according to another exemplary embodiment of the present disclosure.

FIG. 16 is a plan view showing one output pad group according to another exemplary embodiment of the present disclosure.

When compared with the output pad group OPDG1-1 shown in FIG. 14, an output pad group OPDG1-2 shown in FIG. 16 includes pads having different shapes from each other.

In FIG. 16, the first-first column output pad OPDL1-2 has the third shape, the second-first column output pad OPDL2-2 has the second shape, and the third- to sixth-first column output pads OPDL3-2 to OPDL6-2 have the third shape.

In FIG. 16, the first-second column output pad OPDH1-2 has the sixth shape, the second-second column output pad OPDH2-2 has the fifth shape, and the third- to sixth-second column output pad OPDH3-2 to OPDH6-2 have the fourth shape.

In FIG. 16, the first column output pads OPDL-2 are spaced apart from each other along the second direction DR2 by a first interval T1.

The first- and second-second column output pads OPDH1-2 and OPDH2-2 are spaced apart from each other by a second interval T2 along the second direction DR2. The second- and third-second column output pads OPDH2-2 and OPDH3-2 are spaced apart from each other by a second interval T2 along the second direction DR2. The third- and fourth-second column output pads OPDH3-2 and OPDH4-2 are spaced apart from each other by the third interval T3 along the second direction DR2. The fourth- and fifth-second column output pads OPDH4-2 and OPDH5-2 are spaced apart from each other by the third interval T3 along the second direction DR2. The fifth- and sixth-second column output pads OPDH5-2 and OPDH6-2 are spaced apart from each other by the second interval T2 along the second direction DR2. The first interval T1 may be different from the second interval T2.

The output pad group OPDG1-2 shown in FIG. 16 may have a relatively reduced width along the first direction DR1 when compared with the output pad group OPDG1 shown in FIG. 3. Thus, according to the display device 100, the number of the output pad groups arranged along the first direction DR1 on the flexible printed circuit board 120 may be increased.

Figure 17:
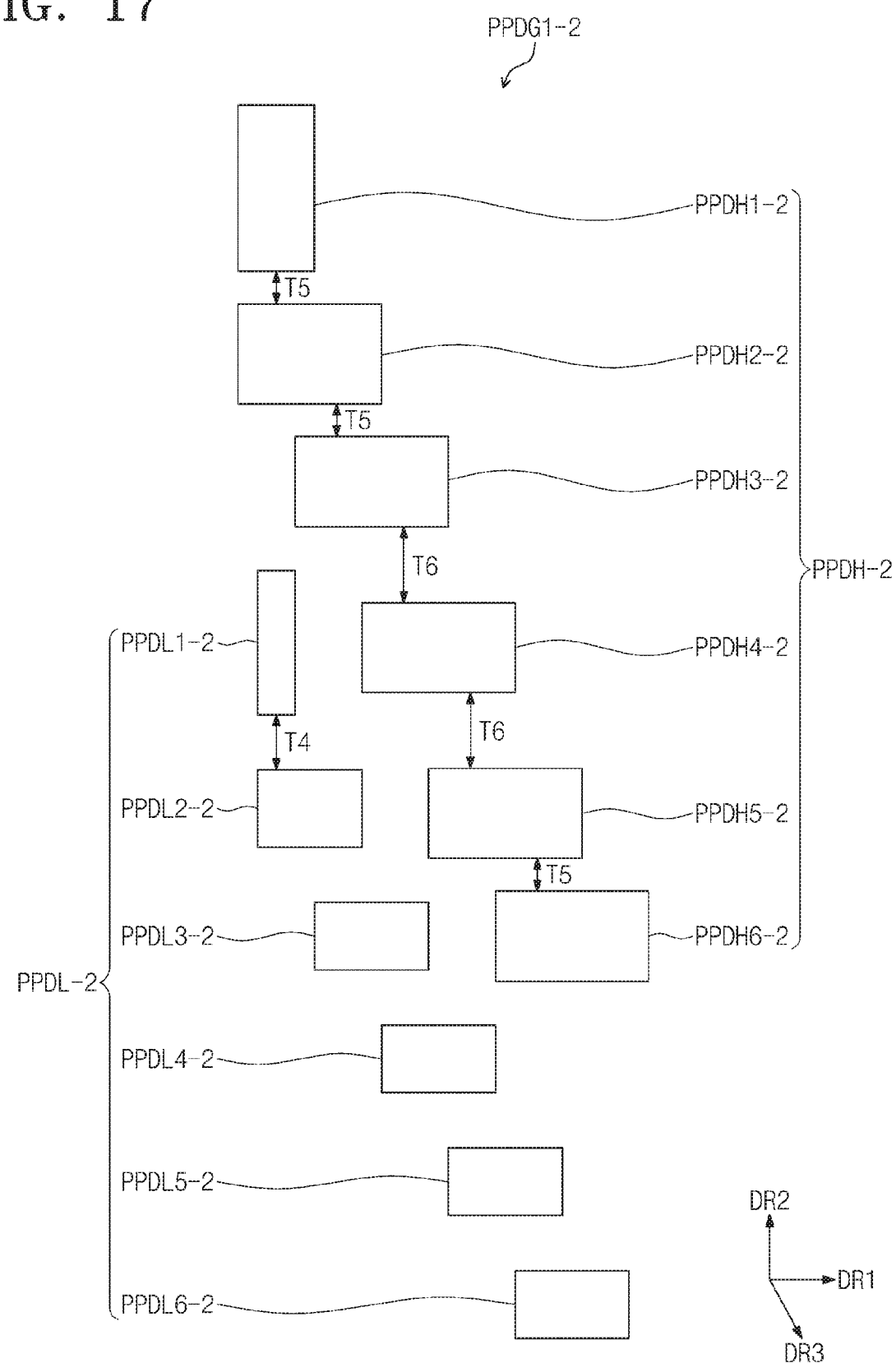
FIG. 17 is a plan view showing panel pads corresponding to the output pad group shown in FIG. 16.

FIG. 17 is a plan view showing panel pads corresponding to the output pad group shown in FIG. 16.

When compared with the panel pad group PPDG1-1 shown in FIG. 15, a panel pad group PPDG1-2 shown in FIG. 17 includes pads having different shapes from each other.

In FIG. 17, the first-first column panel pad PPDL1-2 has the sixth shape, the second-first column panel pad PPDL2-2 has the fifth shape, and the third- to sixth-first column panel pads PPDL3-2 to PPDL6-2 have the fourth shape.

In FIG. 17, the first-second column panel pads PPDH1-2 has the third shape, the second-second column panel pad PPDH2-2 has the second shape, and the third-to sixth-second column panel pads PPDH3-2 to PPDH6-2 have the fourth shape.

In FIG. 17, the first column panel pads PPDL-2 are spaced apart from each other along the second direction DR2 by a fourth interval T4.

The first- and second-second column panel pads PPDH1-2 and PPDH2-2 are spaced apart from each other by a fifth interval T5 along the second direction DR2. The second- and third-second column panel pads PPDH2-2 and PPDH3-2 are spaced apart from each other by the fifth interval T5 along the second direction DR2. The third- and fourth-second column panel pads PPDH3-2 and PPDH4-2 are spaced apart from each other by the sixth interval T6 along the second direction DR2. The fourth- and fifth-second column panel pads PPDH4-2 and PPDH5-2 are spaced apart from each other by the sixth interval T6 along the second direction DR2. The fifth- and sixth-second column panel pads PPDH5-2 and PPDH6-2 are spaced apart from each other by the fifth interval T5 along the second direction DR2. The fourth interval T4 may be different from the fifth interval T5.

The panel pad group PPDG1-2 shown in FIG. 17 may have a relatively reduced width along the first direction DR1 when compared with the panel pad group PPDG1-1 shown in FIG. 15. Thus, according to the display device 100, the number of the output pad groups arranged along the first direction DR1 in the mounting area MA of the display panel 110 may be increased.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "lower", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. Thus, the example terms "lower" and "upper" can encompass both an orientation of above and below. The device may be otherwise oriented (e.g., rotated 90 degrees or at other orientations) and the spatially relative descriptors used herein should be interpreted accordingly. In addition, it will also be understood that when an element is referred to as being "between" two elements, it can be the only element between the two elements, or one or more intervening elements may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Although the exemplary embodiments of the present invention have been described, it is understood that the present invention should not be limited to these exemplary embodiments but various changes and modifications can be made by one ordinary skilled in the art within the spirit and scope of the present invention as define by the following claims and their equivalents.

What is claimed is:

1. A display device comprising:
   a printed circuit board, two sides of the printed circuit board extending in first and second directions, respectively, the first and second directions crossing each other, a plurality of pad group areas being defined in the printed circuit board and arranged along the first direction; and
   a display panel electrically connected to the printed circuit board through the pad group areas, the printed circuit board comprising:
   first column pads in each of the pad group areas and arranged along a third direction crossing the first and second directions; and
   second column pads in each of the pad group areas, arranged along the third direction, and spaced apart from the first column pads, wherein each of the pad group areas comprises first, second, and third pad areas sequentially arranged along the second direction, a portion of the first column pads is in the first pad area, an other portion of the first column pads and a portion of the second column pads are in the second pad area, an other portion of the second column pad is in the third pad area, and each of the second column pads has an area greater than an area of each of the first column pads.

2. The display device of claim 1, wherein the pad group areas are at one side portion of the printed circuit board along the second direction, and the second column pads are closer to the one side portion of the printed circuit board along the second direction than the first column pads.

3. The display device of claim 1, wherein the display panel comprises:
   first column panel pads overlapped with respective ones of the first column pads when viewed in a plan view; and
   second column panel pads overlapped with respective ones of the second column pads when viewed in a plan view, a portion of the first column panel pads is in the first pad area, an other portion of the first column panel pads and a portion of the second column panel pads are in the second pad area, and the other portion of the second column panel pads is in the third pad area.

4. The display device of claim 3, wherein the first column pads cover respective ones of the first column panel pads when viewed in a plan view, and the second column panel pads cover respective ones of the second column pads when viewed in a plan view.

5. The display device of claim 4, wherein each of the first column pads has an area greater than an area of each of the first column panel pads, and each of the second column panel pads has an area greater than an area of each of the second column pads.

6. The display device of claim 5, wherein each of the first column pads has a same area as each of the second column panel pads, and each of the second column pads has a same area as each of the first column panel pads.

7. The display device of claim 3, wherein the display panel further comprises:
   first column panel lines connected to respective ones of the first column panel pads; and
   second column panel lines connected to respective ones of the second column panel pads.

8. The display device of claim 7, wherein the first column panel lines, the second column panel lines, the first column panel pads, and the second column panel pads are at a same layer.

9. The display device of claim 7, wherein the first column panel lines are alternately arranged with the second column panel lines along the first direction.

10. The display device of claim 9, wherein one of the first column panel lines passes between two second column panel pads adjacent to each other from among the second column panels.

11. The display device of claim 10, wherein the first column panel lines are not overlapped with respective ones of the second column pads.

12. The display device of claim 1, wherein the first column pads and the second column pads are at a same layer.

13. The display device of claim 1, wherein the printed circuit board further comprises:
   a base substrate;
   via lands on one surface of the base substrate;
   via patterns overlapped with the via lands and penetrating through the base substrate; and
   a driving circuit chip on an other surface facing the one surface of the base substrate and electrically connected to the first column pads and the second column pads, the first column pads being on the other surface of the base substrate, the second column pads being on the other surface of the base substrate to overlap with respective ones of the via patterns, and the second column pads are electrically connected to the driving circuit chip through respective ones of the via lands and the via patterns.

14. The display device of claim 13, wherein the printed circuit board further comprises:
   first lines on the other surface of the base substrate to connect the driving circuit chip and each of the first column pads; and
   second lines connecting the driving circuit chip and each of the via lands, and the second lines comprise:
      second upper lines on the one surface of the base substrate and connected to respective ones of the via lands;
      second lower lines on the other surface of the base substrate and connected to the driving circuit chip; and
      second via patterns penetrating through the base substrate to respectively connect the second upper lines to the second lower lines.

15. The display device of claim 1, wherein one first column pad of the first column pads has a first shape, an other first column pad of the first column pads has a second shape different from the first shape, one second column pad of the second column pads has a third shape having an area smaller than the first shape, and an other second column pad of the second column pads has a fourth shape different from the third shape and having an area smaller than the second shape.

16. The display device of claim 15, wherein each of the first, second, third, and fourth shapes has a substantially quadrangular shape, a length along the first direction of the second shape is less than a length along the first direction of the first shape by a first length, a length along the second direction of the second shape is greater than a length along the second direction of the second shape by the first length, a length along the first direction of the fourth shape is less than a length along the first direction of the third shape by a second length, and a length along the second direction of the fourth shape is greater than a length along the second direction of the third shape by the second length.

17. The display device of claim 16, wherein the first column pads in respective ones of the pad group areas sequentially comprise first- to (n-th)-first column pads, and the first-first column pad or the (n-th)-first column pad has the second shape, and
   wherein the second column pads in respective ones of the pad group areas sequentially comprise first- to (n-th)-second column pads, and the first-second column pad or the (n-th)-second column pad has the fourth shape.

* * * * *